US011956975B2

(12) United States Patent
Seo et al.

(10) Patent No.: US 11,956,975 B2
(45) Date of Patent: Apr. 9, 2024

(54) BEOL FAT WIRE LEVEL GROUND RULE COMPATIBLE EMBEDDED ARTIFICIAL INTELLIGENCE INTEGRATION

(71) Applicant: International Business Machines Corporation, Armonk, NY (US)

(72) Inventors: Soon-Cheon Seo, Glenmont, NY (US); Dexin Kong, Redmond, WA (US); Takashi Ando, Eastchester, NY (US); Paul Charles Jamison, Hopewell Junction, NY (US); Hiroyuki Miyazoe, White Plains, NY (US); Youngseok Kim, Upper Saddle River, NJ (US); Nicole Saulnier, Slingerlands, NY (US); Vijay Narayanan, New York, NY (US); Iqbal Rashid Saraf, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 17/477,039

(22) Filed: Sep. 16, 2021

(65) Prior Publication Data

US 2023/0079392 A1   Mar. 16, 2023

(51) Int. Cl.
*H10B 63/00* (2023.01)
*H01L 23/522* (2006.01)
*H10N 70/00* (2023.01)

(52) U.S. Cl.
CPC ......... *H10B 63/80* (2023.02); *H01L 23/5226* (2013.01); *H10N 70/063* (2023.02); *H10N 70/8416* (2023.02)

(58) Field of Classification Search
CPC ................ H10B 63/80; H01L 23/5226; H10N 70/8416; H10N 70/063
USPC .......................................................... 257/2
See application file for complete search history.

(56) References Cited

U.S. PATENT DOCUMENTS

| 9,343,659 | B1 | 5/2016 | Lu et al. |
| 9,450,183 | B2 | 9/2016 | Huang et al. |
| 9,966,530 | B2 | 5/2018 | Jang et al. |
| 10,636,963 | B2 | 4/2020 | Dai et al. |
| 10,832,941 | B2 | 11/2020 | Seo et al. |
| 10,839,122 | B1* | 11/2020 | Quay .................... G06F 30/327 |
| 10,950,549 | B2 | 3/2021 | Seo et al. |
| 2012/0210040 | A1* | 8/2012 | Masleid .............. G06F 13/4022 710/317 |
| 2016/0351806 | A1* | 12/2016 | Hsieh .................... H10N 70/068 |
| 2020/0075855 | A1 | 3/2020 | Tseng et al. |
| 2020/0098828 | A1 | 3/2020 | Chen et al. |
| 2021/0135106 | A1* | 5/2021 | Ku .................... H01L 21/76802 |

* cited by examiner

*Primary Examiner* — Tu-Tu V Ho
(74) *Attorney, Agent, or Firm* — Scully, Scott, Murphy & Presser, P.C.; L. Jeffrey Kelly, Esq.

(57) ABSTRACT

Structures and methods are provided for integrating a resistance random access memory (ReRAM) in a back-end-on-the-line (BEOL) fat wire level. In one embodiment, a ReRAM device area contact structure is provided in the BEOL fat wire level that has at least a lower via portion that contacts a surface of a top electrode of a ReRAM device area ReRAM-containing stack. In other embodiments, a tall ReRAM device area bottom electrode is provided in the BEOL fat wire level and embedded in a dielectric material stack that includes a dielectric capping layer and an interlayer dielectric material layer.

20 Claims, 36 Drawing Sheets

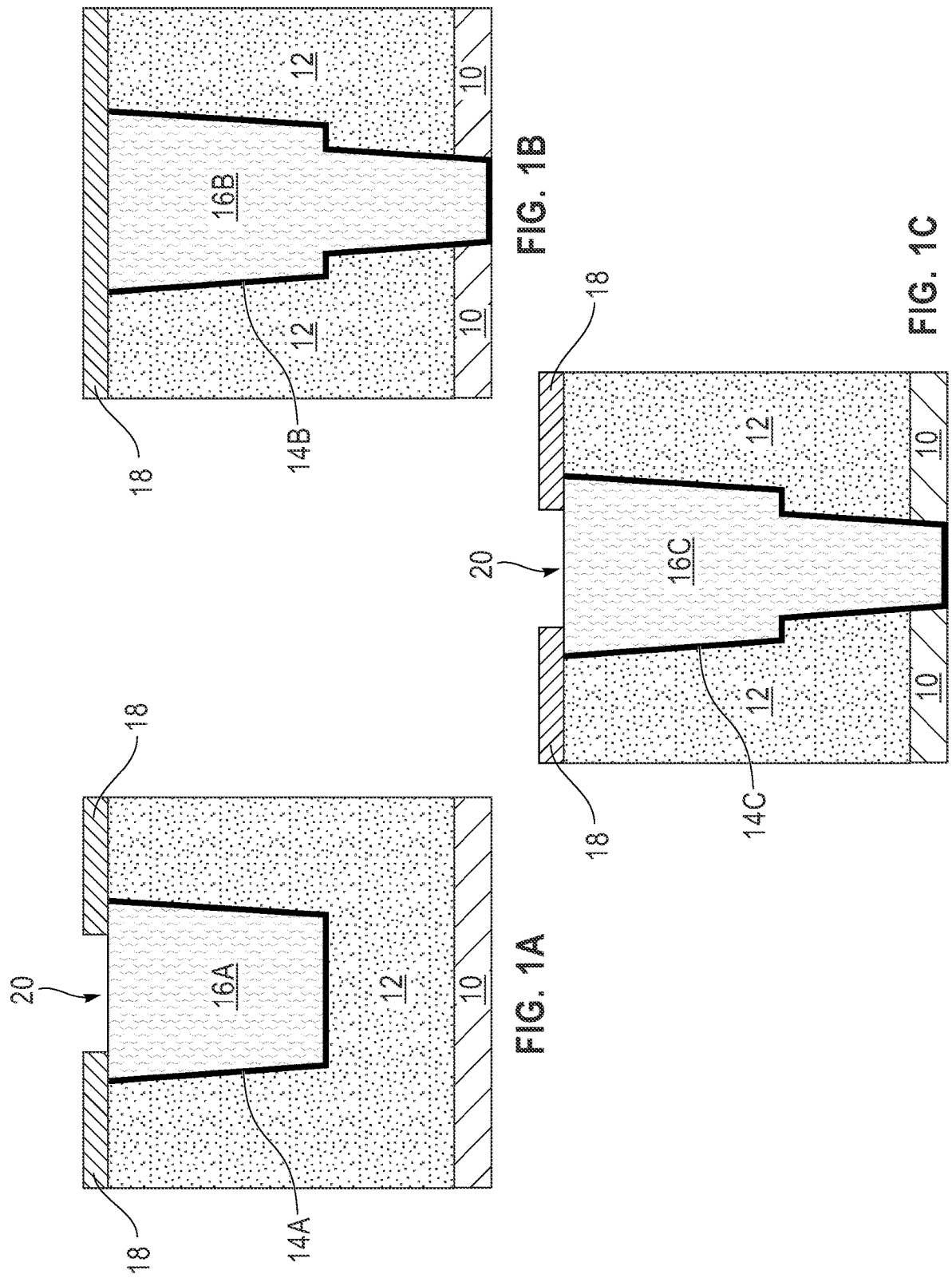

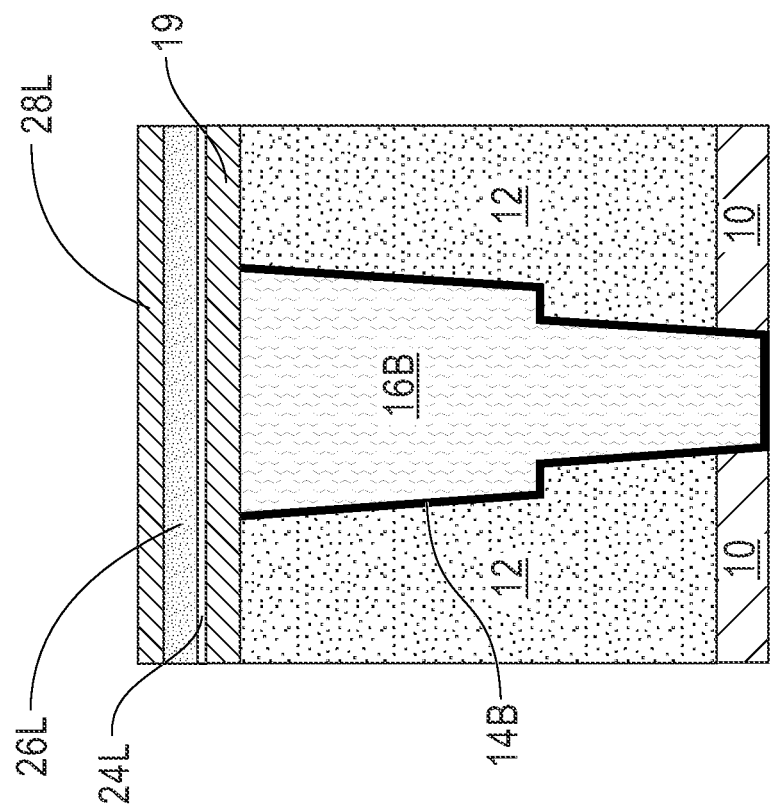
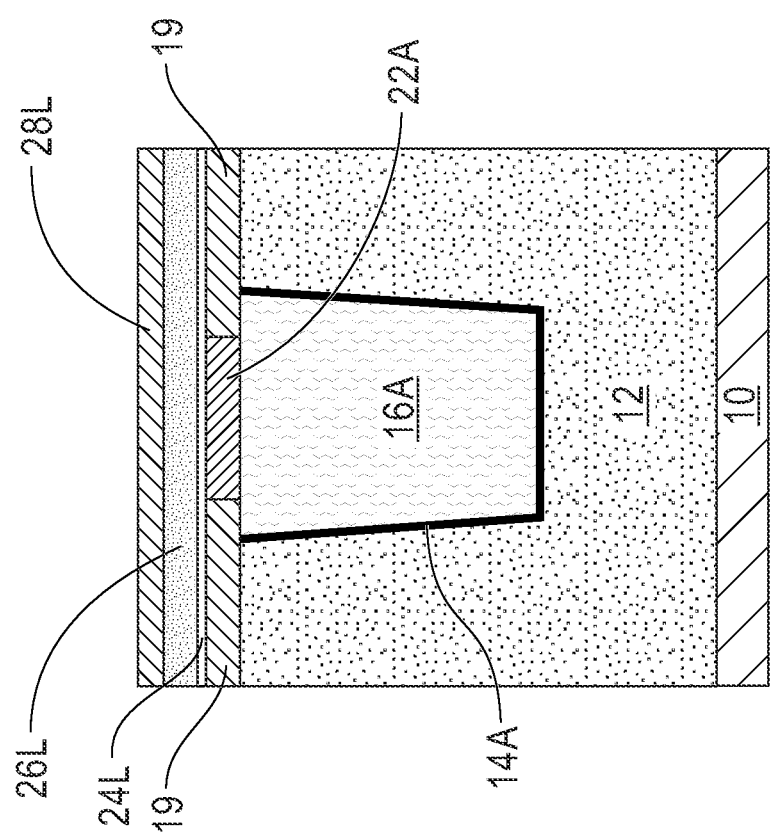
FIG. 3A
FIG. 3B

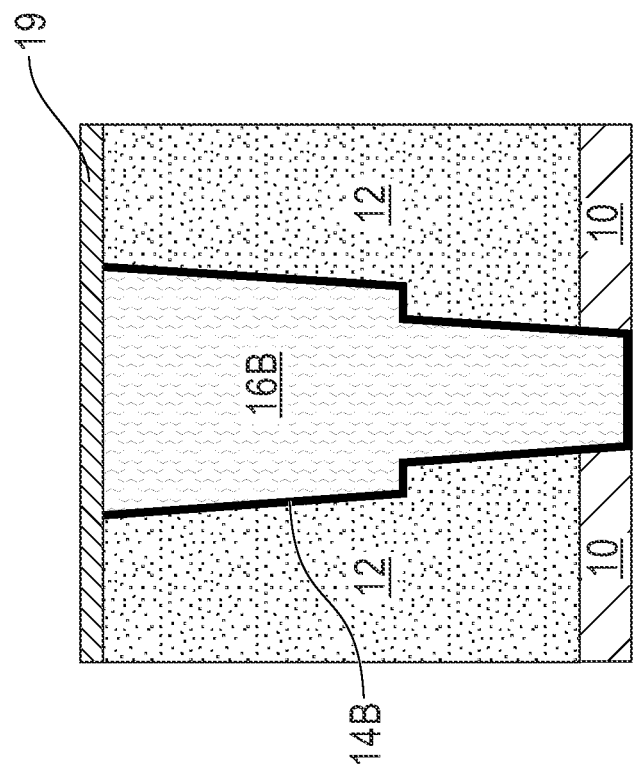
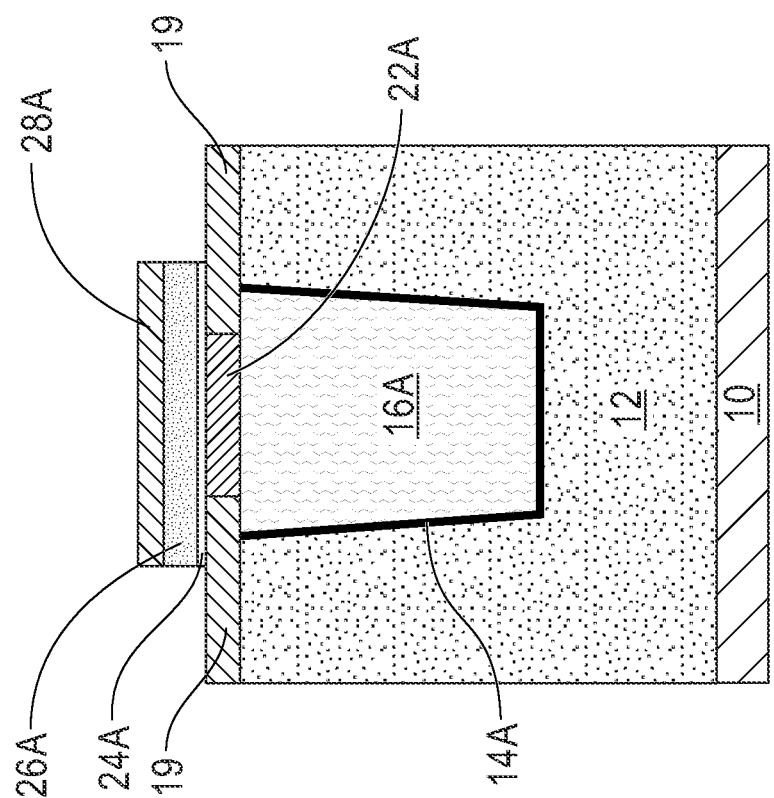
FIG. 4B
FIG. 4A

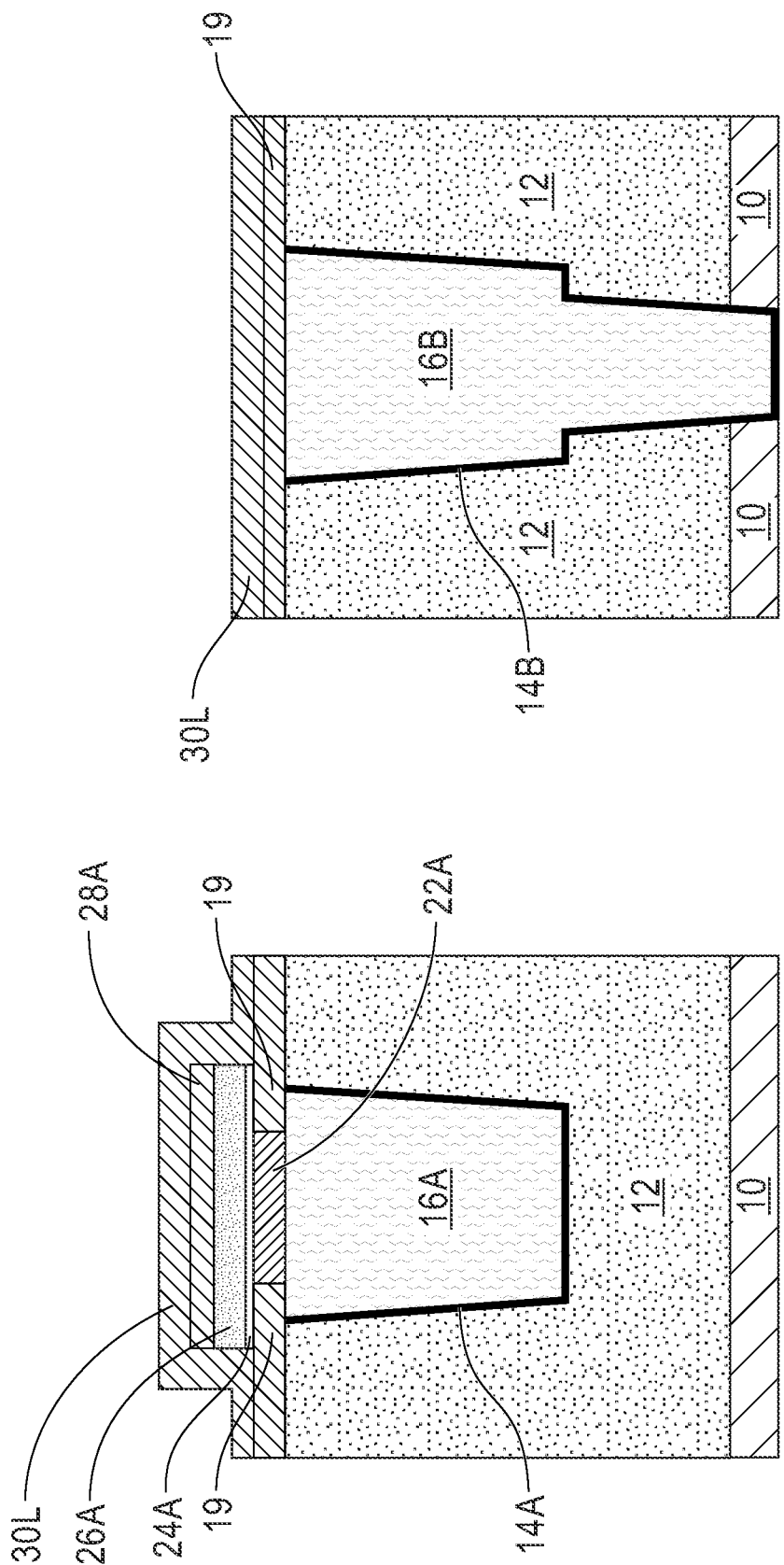

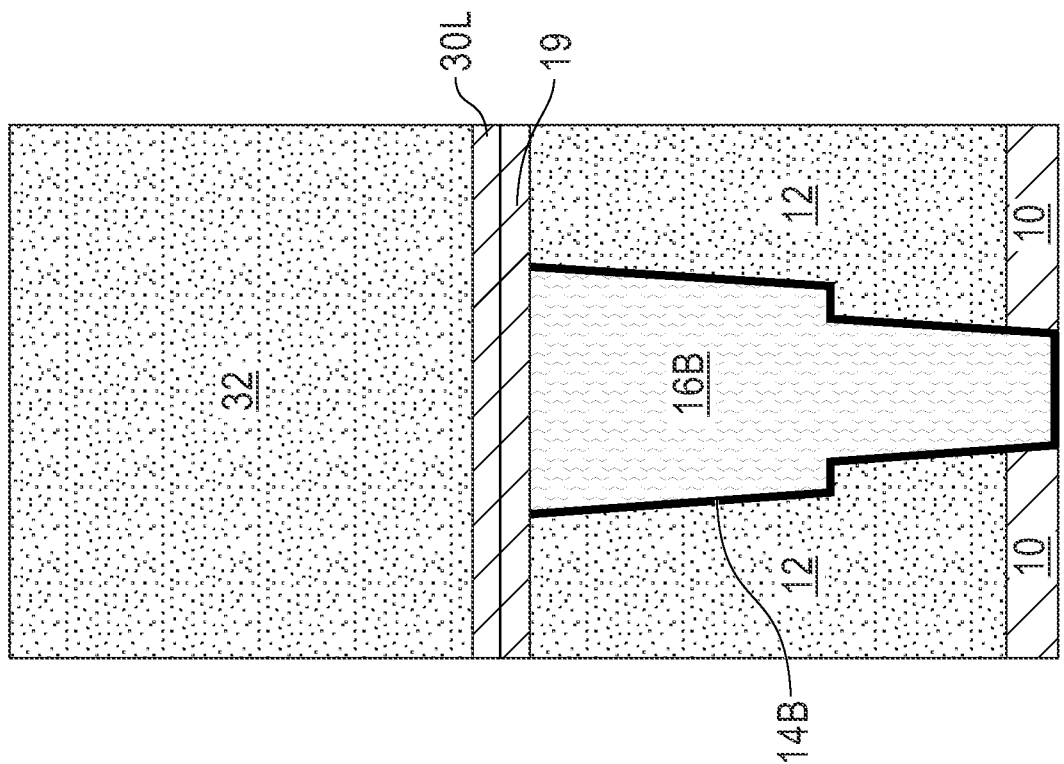
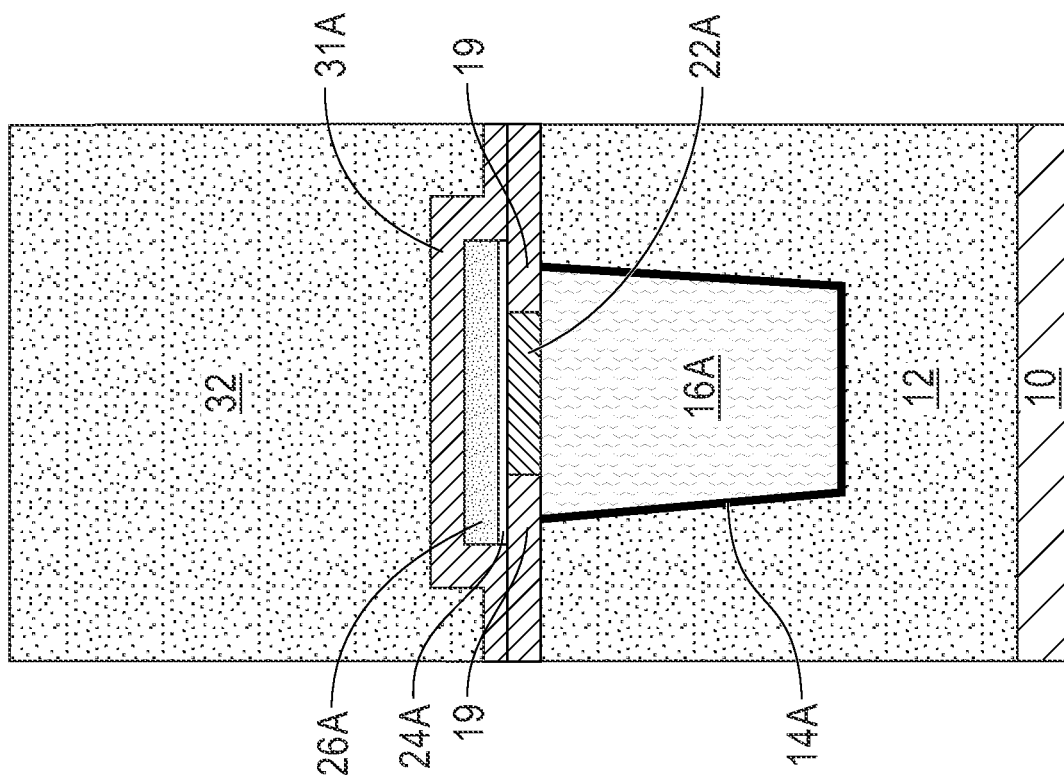
FIG. 6A
FIG. 6B

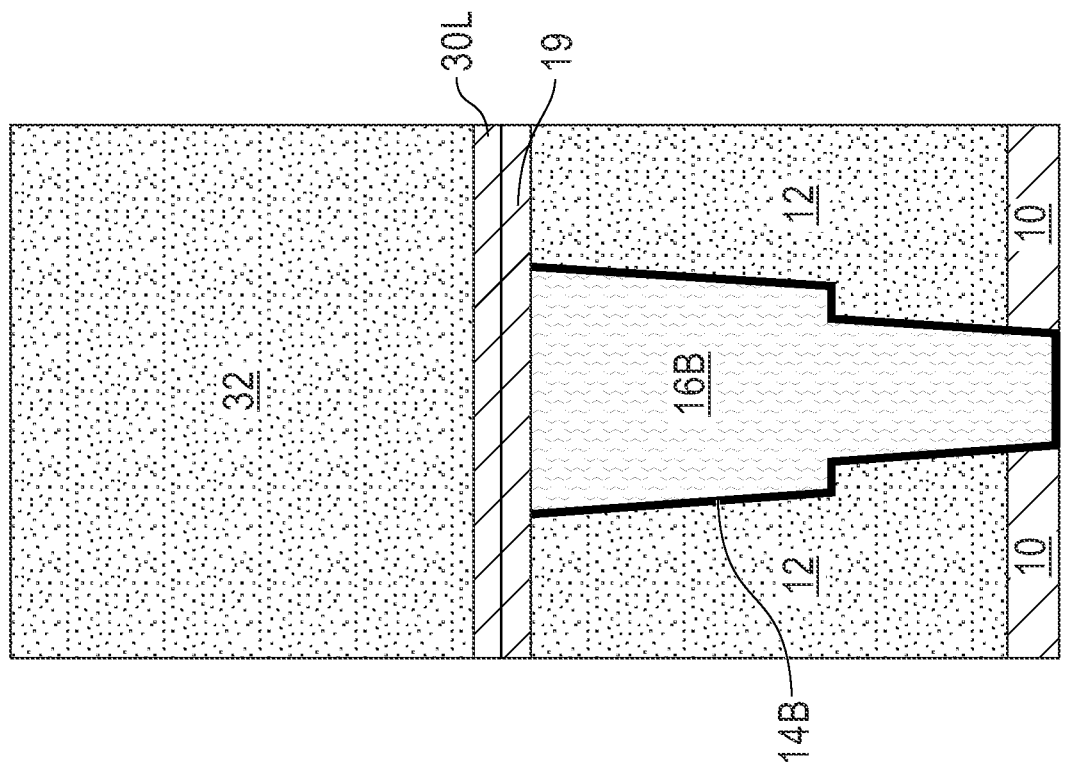
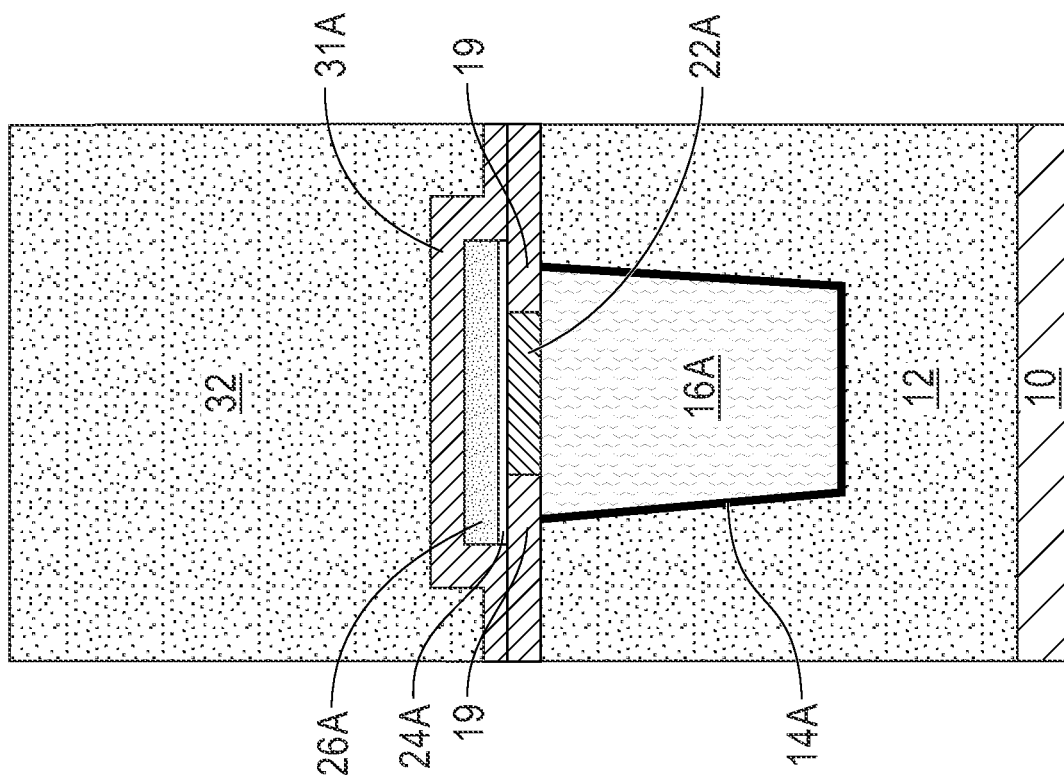

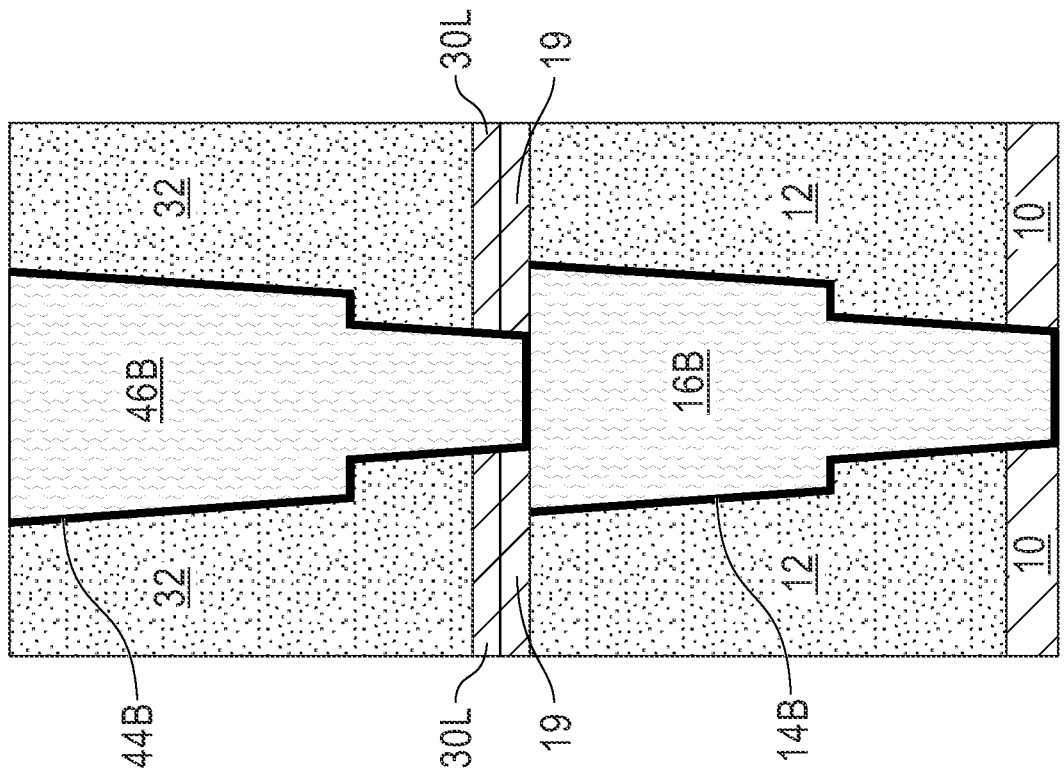
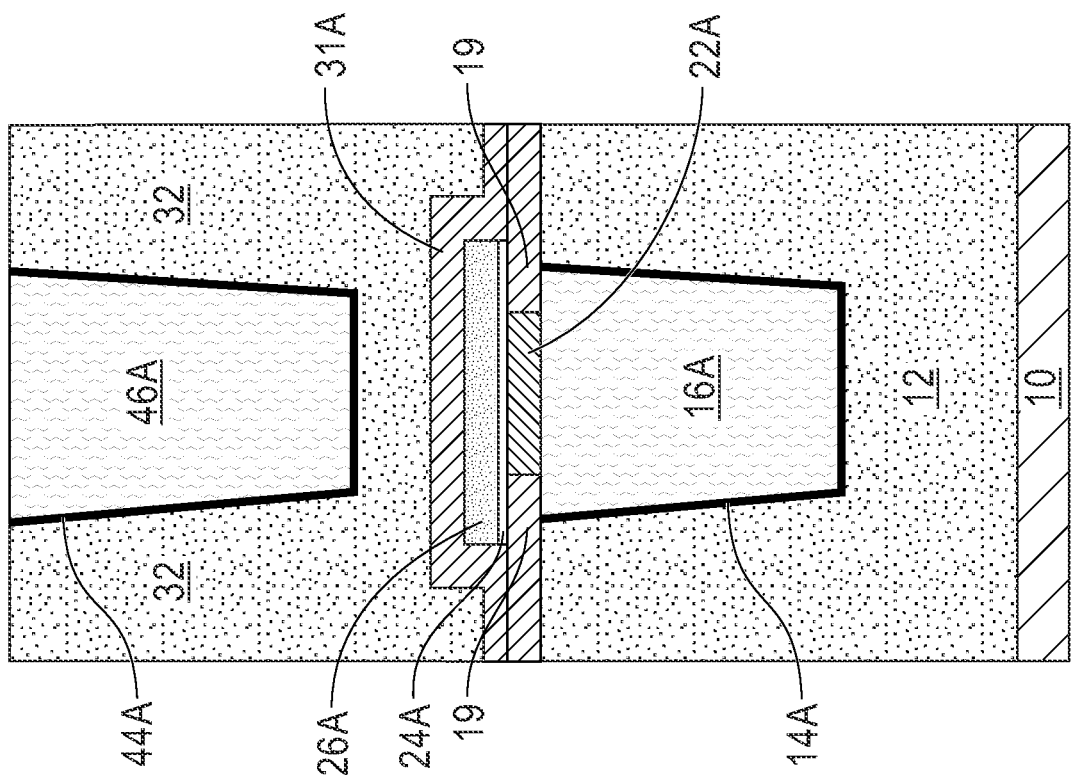

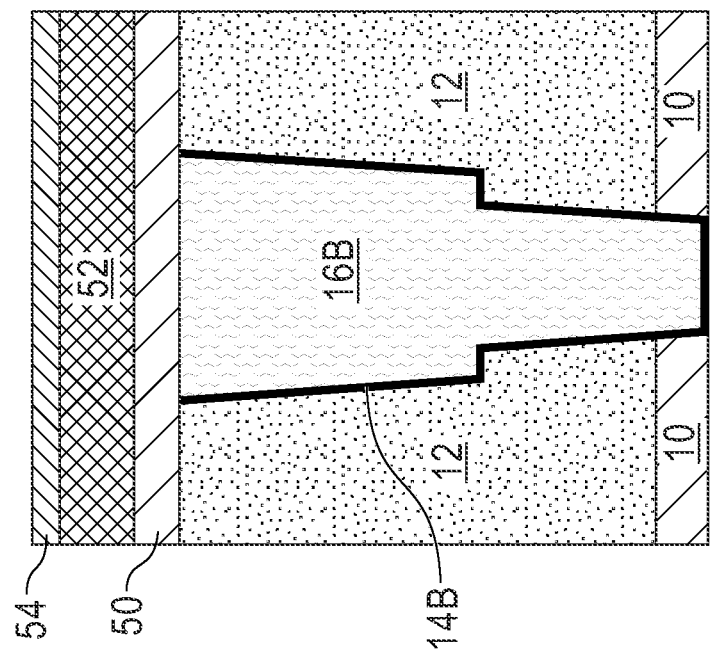
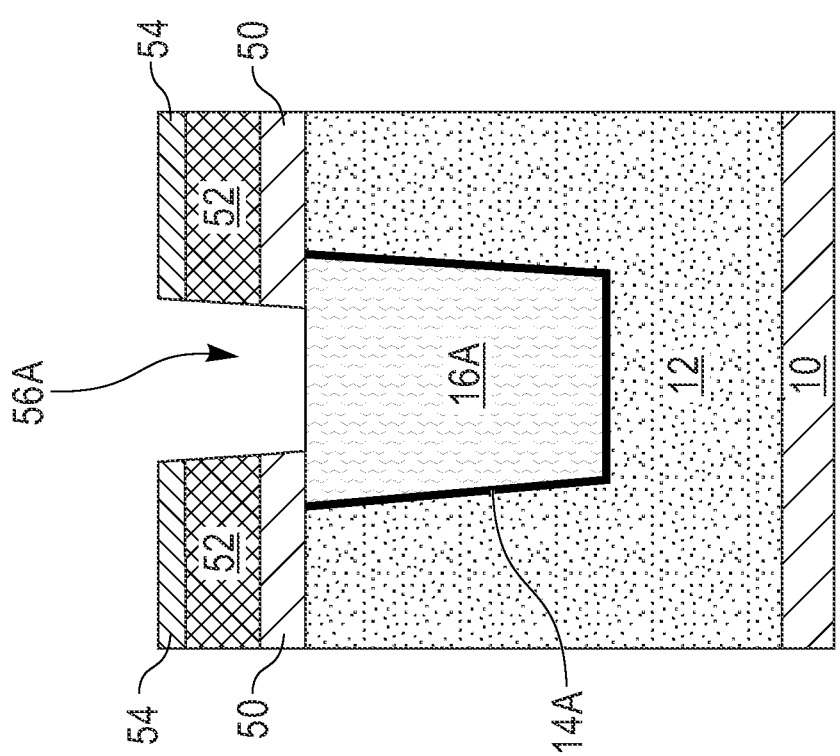

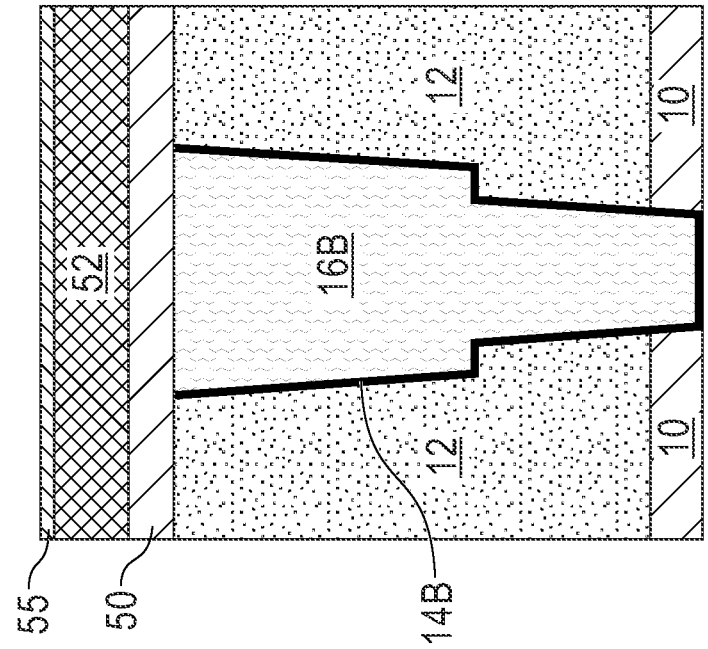
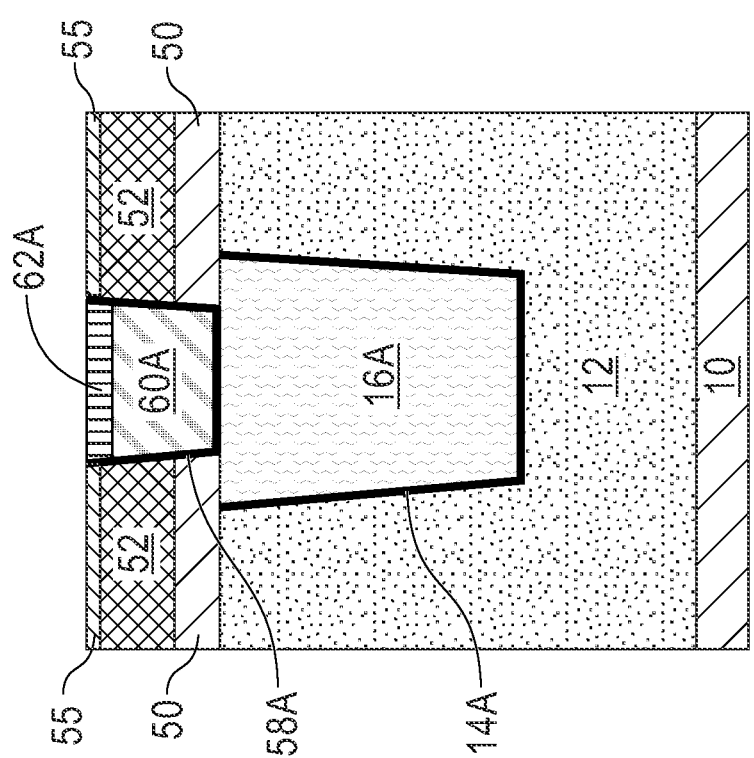
FIG. 12B
FIG. 12A

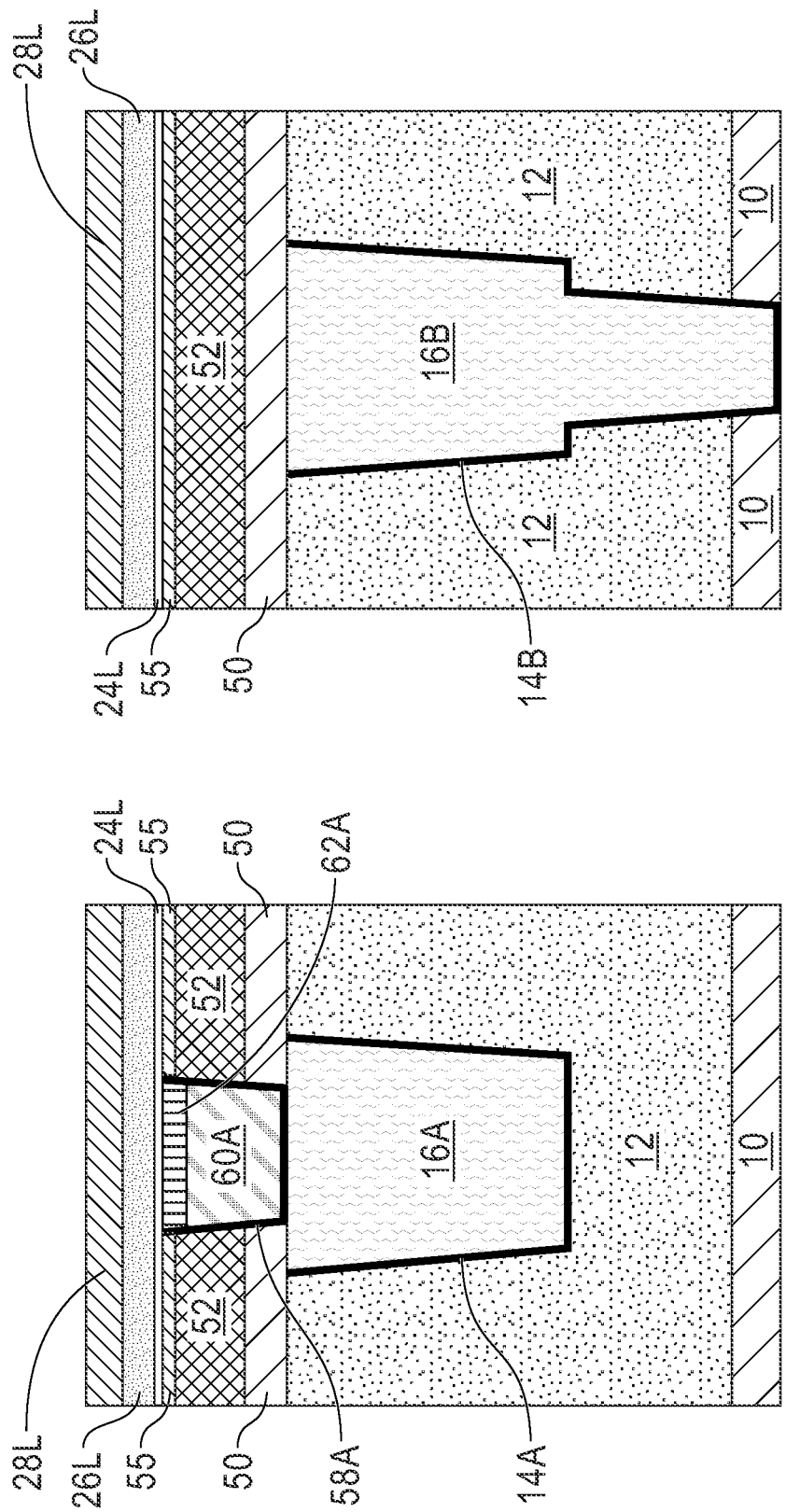

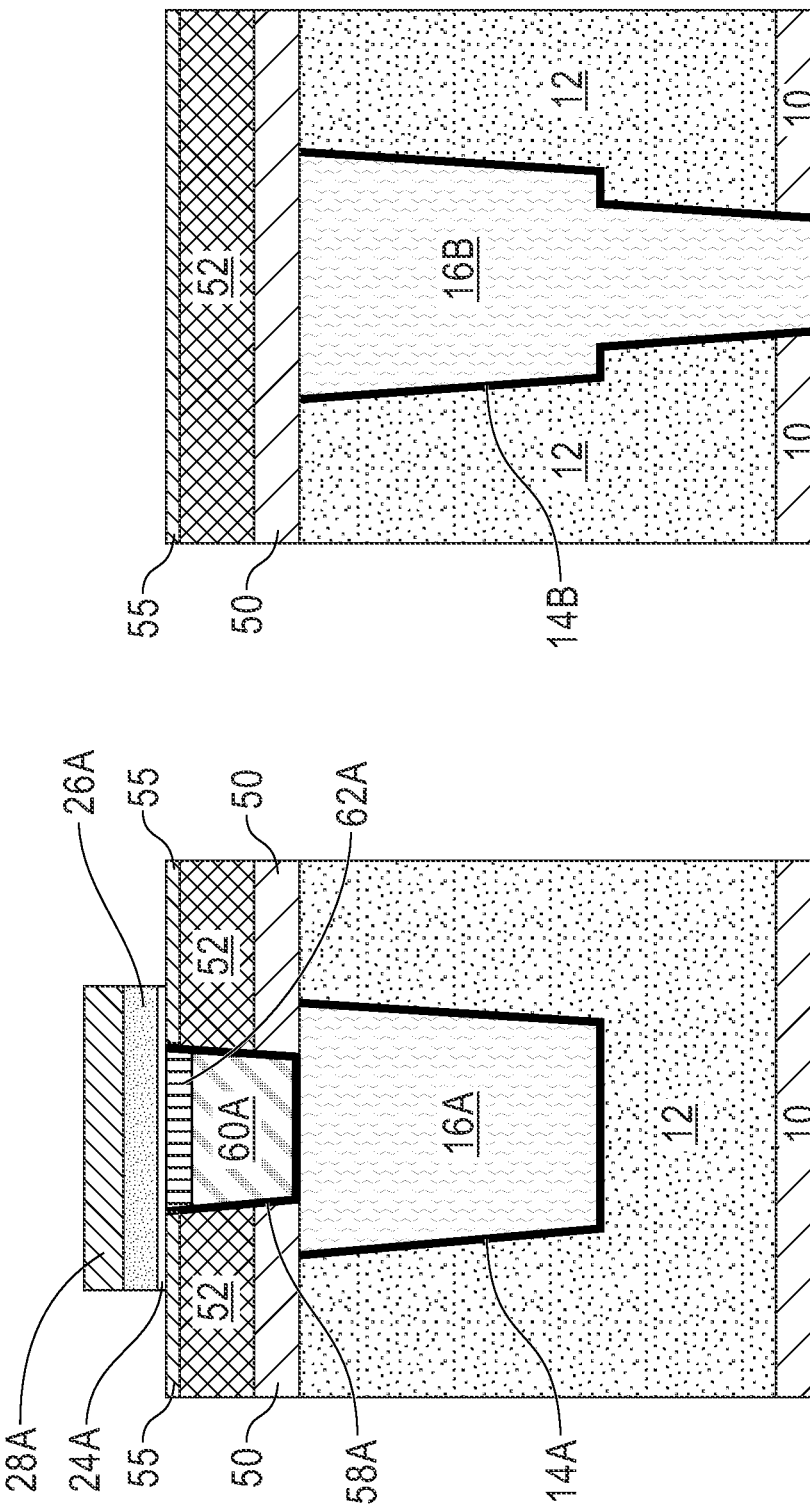

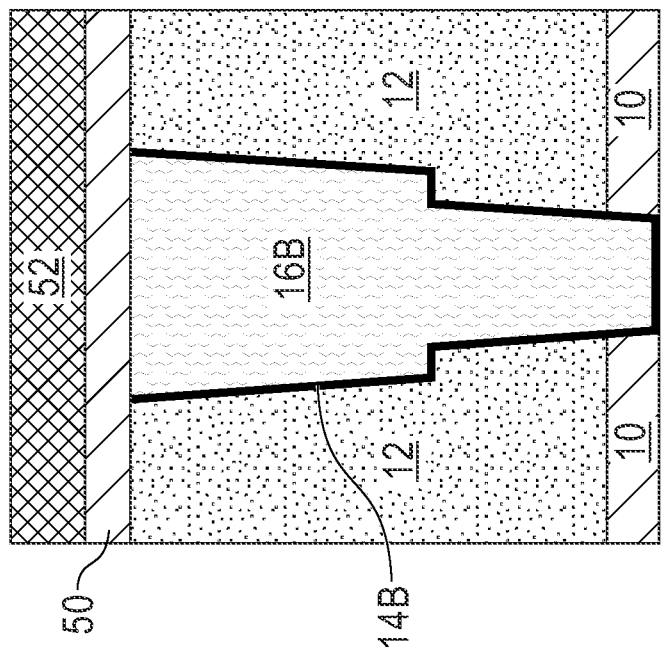
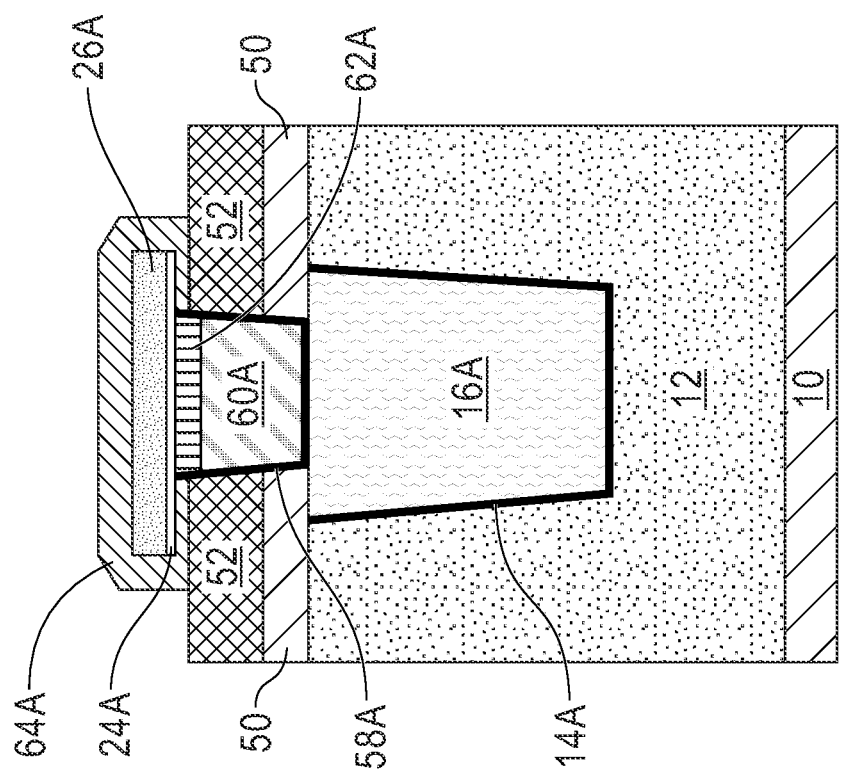
FIG. 15A
FIG. 15B

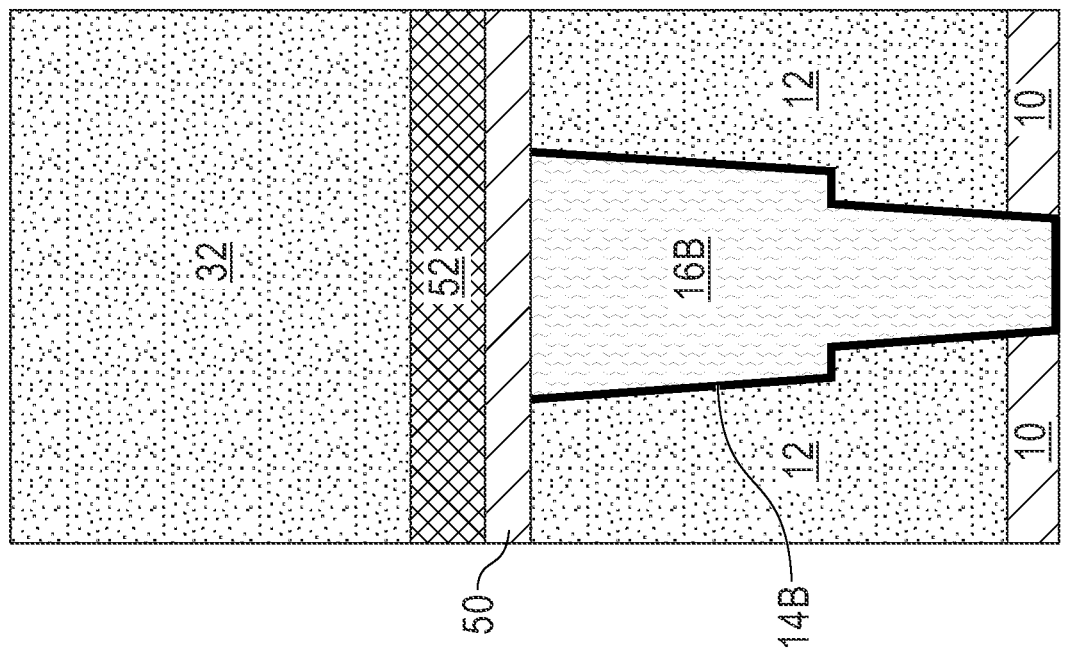
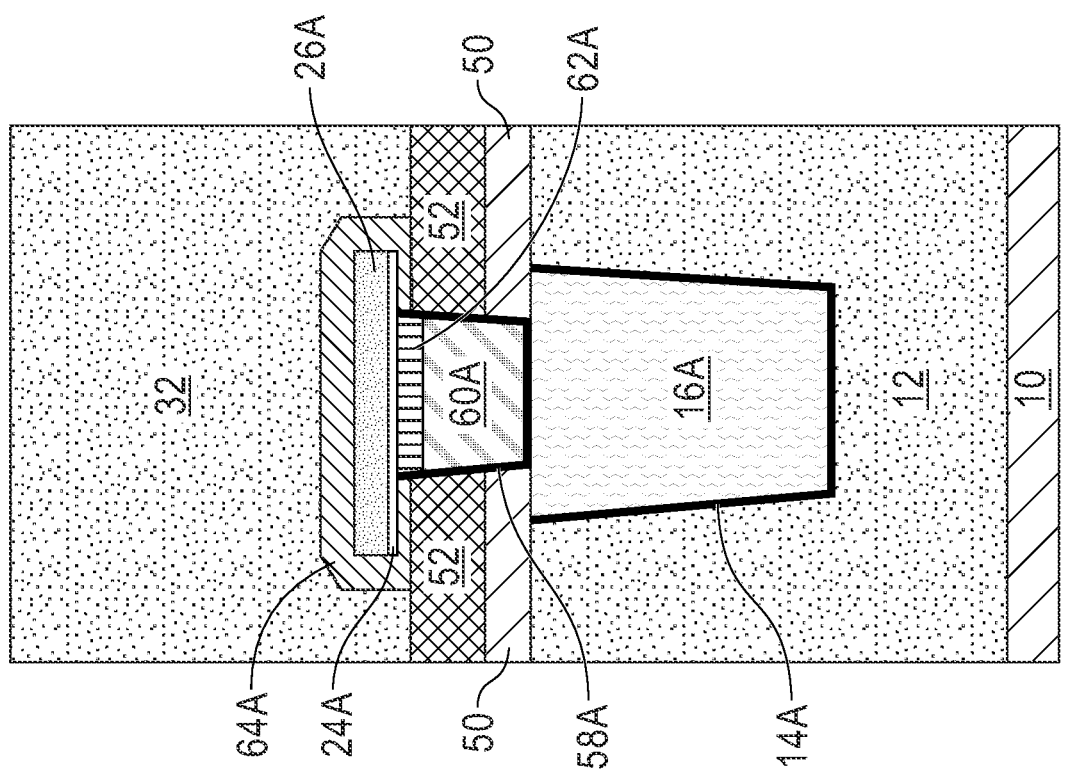

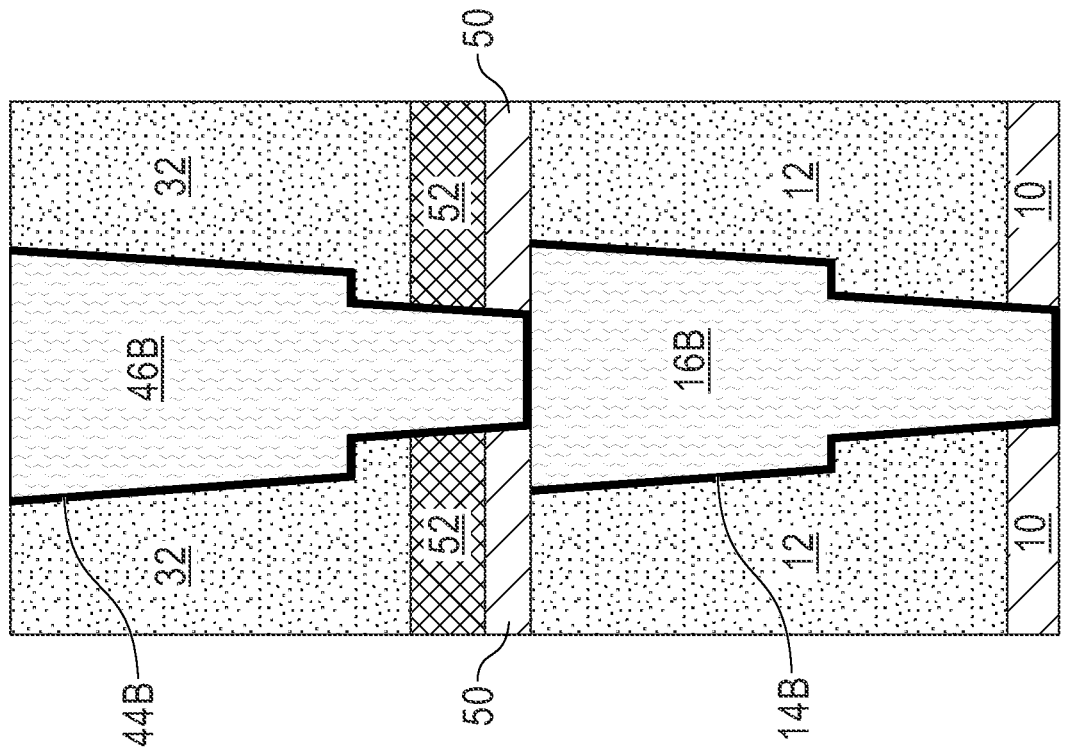
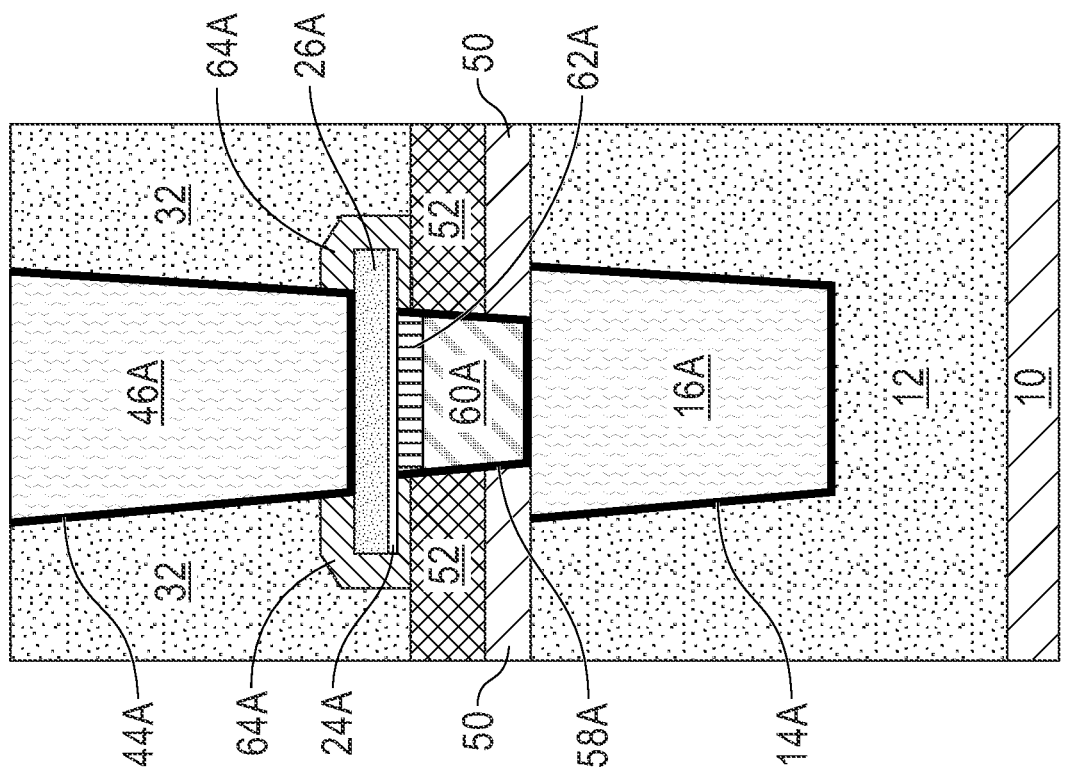

BEOL FAT WIRE LEVEL GROUND RULE COMPATIBLE EMBEDDED ARTIFICIAL INTELLIGENCE INTEGRATION

BACKGROUND

The present application relates to non-volatile memory (NVM), and more particularly to a resistive random access memory (ReRAM) integrated in a back-end-on-the-line (BEOL) fat wire level.

NVM or non-volatile storage is a type of computer memory that can retain stored information even after power is removed. In contrast, volatile memory needs constant power in order to retain data. ReRAM (or sometimes referred to as RRAM) is a type of NVM that is considered as a promising technology for electronic synapse devices or memristors for neuromorphic computing as well as high-density and high-speed NVM applications. In neuromorphic computing applications, a resistance memory device such as ReRAM device can be used as a connection (i.e., synapse) between a pre-neuron and a post-neuron, representing the connection weight in form of device resistance.

ReRAM integration at the BEOL fat wire level is challenging since the stack of the ReRAM is relatively thin as compared to the fat wire BEOL ground rule. As used throughout this application, a "fat wire level" refers to upper interconnect layers with a wider size than the minimum ground rule (normally M1) for a certain technology node. For example, in 32 nm node, minimum ground rule at M1 is approximately 32 nm. In such an example, one could have 1× design for M1, M2, M3; 2× design for M4-M5; 8× design for M6-M7; 16× for . . . etc. In this example, all 2×, 4×, and 8× layers are referred to "fat wire levels". Therefore, the top and bottom connections to the ReRAM require special integration which ensures seamless co-integration with the logic circuit area. Such seamless co-integration is not however currently available.

SUMMARY

Structures and methods are provided for integrating ReRAM in a BEOL fat wire level. In one embodiment, a ReRAM device area contact structure is provided in the BEOL fat wire level that has at least a lower via portion that contacts a surface of a top electrode of a ReRAM device area ReRAM-containing stack. In other embodiments, a tall ReRAM device area bottom electrode is provided in the BEOL fat wire level and embedded in a dielectric material stack that includes a dielectric capping layer and an interlayer dielectric material layer. The tall ReRAM device area bottom electrode can include a base electrode and a bottom electrode, or it can be entirely composed of the bottom electrode.

In one aspect of the present application, a structure containing a ReRAM integrated in a BEOL fat wire level is provided. In one embodiment of the present application, the structure includes a ReRAM device area including a ReRAM device area first electrically conductive structure embedded in a fat level first interconnect dielectric material layer. The structure further includes a ReRAM device area bottom electrode located on a surface of the ReRAM device area first electrically conductive structure, a dielectric capping layer located laterally adjacent to the ReRAM device area bottom electrode, and a ReRAM device area ReRAM-containing stack located on the ReRAM device area bottom electrode, wherein the ReRAM device area ReRAM-containing stack includes a ReRAM device area dielectric switching layer and a ReRAM device area top electrode. In this embodiment of the present application, the structure further includes a ReRAM device area contact structure located above, and in contact with, the ReRAM device area top electrode, wherein the ReRAM device area contact structure has a lower via portion and an upper trench portion.

The structure of this embodiment can further include a logic device area located laterally adjacent to, or farther away from, the ReRAM device area, the logic device area including a logic device area first electrically conductive structure embedded in the fat level first interconnect dielectric material layer, and a logic device area contact structure located above, and in contact with, the logic device area first electrically conductive structure, wherein logic device area contact structure has a lower via portion and an upper trench portion.

The structure of this embodiment can even further include a fill area located laterally adjacent to, or farther away from, the logic device area and the ReRAM device area, the fill area including a fill area first electrically conductive structure embedded in the fat level first interconnect dielectric material layer, a fill area bottom electrode located on a surface of the fill area first electrically conductive structure, a non-active fill area ReRAM-containing stack located on the fill area bottom electrode, and a fill area contact structure located above, and spaced apart from, the non-active fill area ReRAM-containing stack.

In another embodiment of the present application, the structure includes a ReRAM device area including a ReRAM device area first electrically conductive structure embedded in a fat level first interconnect dielectric material layer. A ReRAM device area bottom electrode is located on a surface of the ReRAM device area first electrically conductive structure, and a dielectric material stack is located laterally adjacent to, and embedding, the ReRAM device area bottom electrode, wherein the dielectric material stack includes a dielectric capping layer and an interlayer dielectric material. The structure further includes a ReRAM device area ReRAM-containing stack located on the ReRAM device area bottom electrode, wherein the ReRAM device area ReRAM-containing stack includes a ReRAM device area dielectric switching layer and a ReRAM device area top electrode. The structure of this embodiment further includes a ReRAM device area dielectric encapsulation structure surrounding the ReRAM device area ReRAM-containing stack, and a ReRAM device area contact structure located above, and in contact with, the ReRAM device area top electrode.

The structure of this embodiment further includes a logic device area that can be located laterally adjacent to, or farther away from, the ReRAM device area, the logic device area including a logic device area first electrically conductive structure embedded in the fat level first interconnect dielectric material layer, and a logic device area contact structure located above, and in contact with, the logic device area first electrically conductive structure, wherein logic device area contact structure has a lower via portion and an upper trench portion.

The structure of this embodiment further includes a fill area located laterally adjacent to, or farther way from, the logic device area and the ReRAM device area, the fill area including a fill area first electrically conductive structure embedded in the fat level first interconnect dielectric material layer, a fill area bottom electrode located on a surface of the fill area first electrically conductive structure, a non-active fill area ReRAM-containing stack located on the fill area bottom electrode, and a fill area trench structure located above the non-active fill area ReRAM-containing stack.

In another aspect of the present application, methods of integrating a ReRAM in a back-end-on-the-line (BEOL) fat wire level are provided. These methods will be apparent from the description provided herein below.

BRIEF DESCRIPTION OF THE DRAWINGS

FIGS. 1A, 1B and 1C are cross sectional views in various areas (e.g., fill area as shown in FIG. 1A, logic device area as shown in FIG. 1B, and ReRAM device area as shown in FIG. 1C) of an exemplary structure after forming a bottom electrode opening in a dielectric capping layer that is present in both the fill area and ReRAM device area, but not the logic device area, wherein the dielectric capping layer in each of the illustrated areas is on a surface of a fat level first interconnect dielectric material layer.

FIGS. 3A, 3B and 3C are cross sectional views of the exemplary structure shown in FIGS. 2A, 2B and 2C, respectively, after forming a ReRAM-containing material stack and a hard mask layer in each of the fill area, the logic device area, and the ReRAM device area, the ReRAM-containing material stack including a dielectric switching layer and a top electrode layer.

FIGS. 4A, 4B and 4C are cross sectional views of the exemplary structure shown in FIGS. 3A, 3B and 3C, respectively, after patterning the dielectric hard mask layer and the ReRAM-containing material stack to provide a dielectric hard mask capped ReRAM-containing structure in each of the fill area and the ReRAM device area, while entirely removing the dielectric hard mask layer and the ReRAM-containing material stack that is present in the logic device area.

FIGS. 5A, 5B and 5C are cross sectional views of the exemplary structure shown in FIGS. 4A, 4B and 4C, respectively, after forming a dielectric encapsulation layer in each of the fill area, the logic device area and the ReRAM device area.

FIGS. 6A, 6B and 6C are cross sectional views of the exemplary structure shown in FIGS. 5A, 5B and 5C, respectively, after forming a fat level second interconnect dielectric material layer on the dielectric encapsulation layer in each of the fill area, the logic device area and the ReRAM device area.

FIGS. 7A, 7B and 7C are cross sectional views of the exemplary structure shown in FIGS. 6A, 6B and 6C, respectively, after forming a ReRAM contact via in the fat level second interconnect dielectric material layer that is present in the ReRAM device area.

FIGS. 10A, 10B and 10C are cross sectional views of the exemplary structure of FIGS. 9A, 9B and 9C after forming a contact structure in the fat level second interconnect dielectric material layer that is present in each of the fill area, the logic device area and the ReRAM device area.

FIGS. 11A, 11B and 11C are cross sectional views in various areas (e.g., fill area as shown in FIG. 11A, logic device area as shown in FIG. 11B, and ReRAM device area as shown in FIG. 11C) of an exemplary structure after forming a bottom electrode opening in a dielectric material stack that is present in both the fill area and ReRAM device area, but not the logic device area, wherein the dielectric material stack in each of the illustrated areas is on a surface of a fat level first interconnect dielectric material layer.

FIGS. 12A, 12B and 12C are cross sectional view of the exemplary structure shown in FIGS. 11A, 11B and 11C, respectively, after forming a base electrode in the bottom electrode opening that is present in both the fill area and the ReRAM device area, and a bottom electrode on each base electrode.

FIGS. 13A, 13B and 13C are cross sectional views of the exemplary structure shown in FIGS. 12A, 12B and 12C, respectively, after forming a ReRAM-containing material stack and a hard mask layer in each of the fill area, the logic device area, and the ReRAM device area, the ReRAM-containing material stack including a dielectric switching layer and a top electrode layer.

FIGS. 14A, 14B and 14C are cross sectional views of the exemplary structure shown in FIGS. 13A, 13B and 13C, respectively, after patterning the dielectric hard mask layer and the ReRAM-containing material stack to provide a dielectric hard mask capped ReRAM-containing structure in each of the fill area and the ReRAM device area, while entirely removing the dielectric hard mask layer and the ReRAM-containing material stack that is present in the logic device area.

FIGS. 15A, 15B and 15C are cross sectional views of the exemplary structure shown in FIGS. 14A, 14B and 14C, respectively, after forming a dielectric encapsulation structure in each of the fill area, the logic device area and the ReRAM device area.

FIGS. 16A, 16B and 16C are cross sectional views of the exemplary structure shown in FIGS. 15A, 15B and 15C, respectively, after forming a fat level second interconnect dielectric material layer on, and laterally adjacent to, the dielectric encapsulation structure in each of the fill area, the logic device area and the ReRAM device area.

FIGS. 19A, 19B and 19C are cross sectional views of the exemplary structure of FIGS. 18A, 18B and 18C after forming a contact structure in the fat level second interconnect dielectric material layer that is present in each of the fill area, the logic device area and the ReRAM device area.

DETAILED DESCRIPTION

Figure 2A:
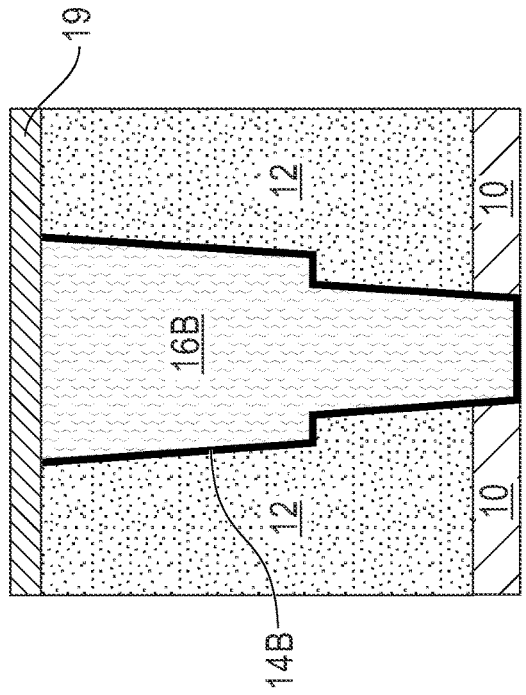
FIGS. 2A, 2B and 2C are cross sectional views of the exemplary structure shown in FIGS. 1A, 1B and 1C, respectively, after forming a bottom electrode in the bottom electrode opening that is present in both the fill area and the ReRAM device area.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 9A:
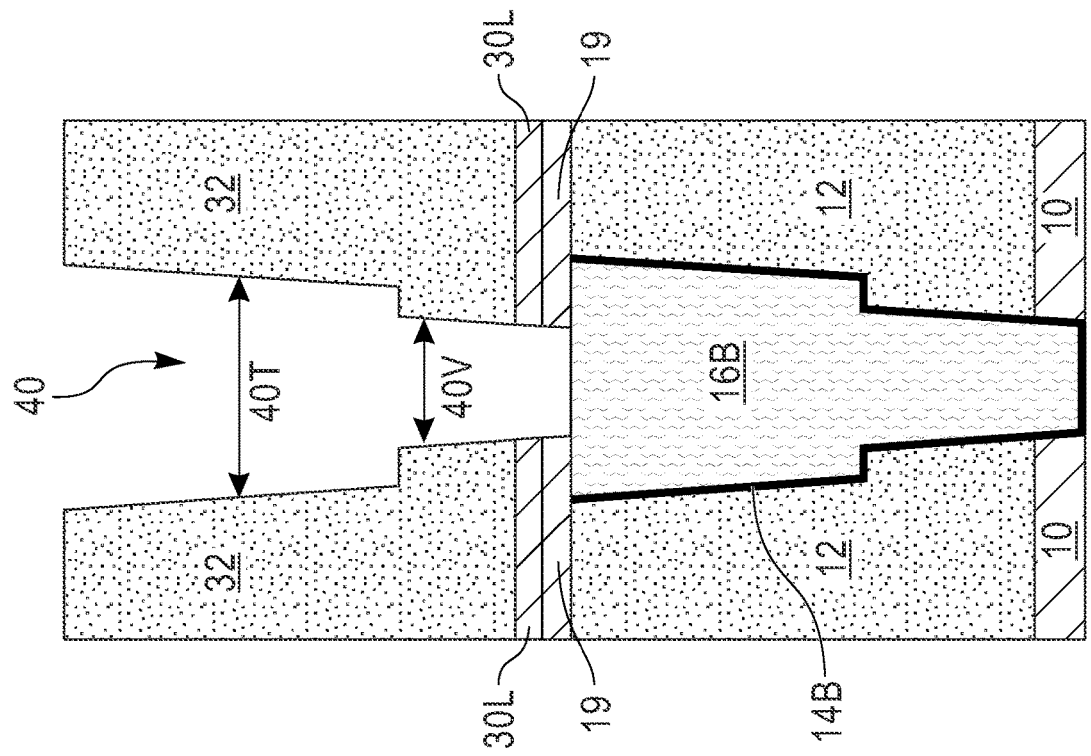
FIGS. 9A, 9B and 9C are cross sectional views of the exemplary structure shown in FIGS. 8A, 8B and 8C after forming a contact trench in the fat level second interconnect dielectric material layer that is present in each of the fill area, the logic device area and the ReRAM device area.
Figure 9B:
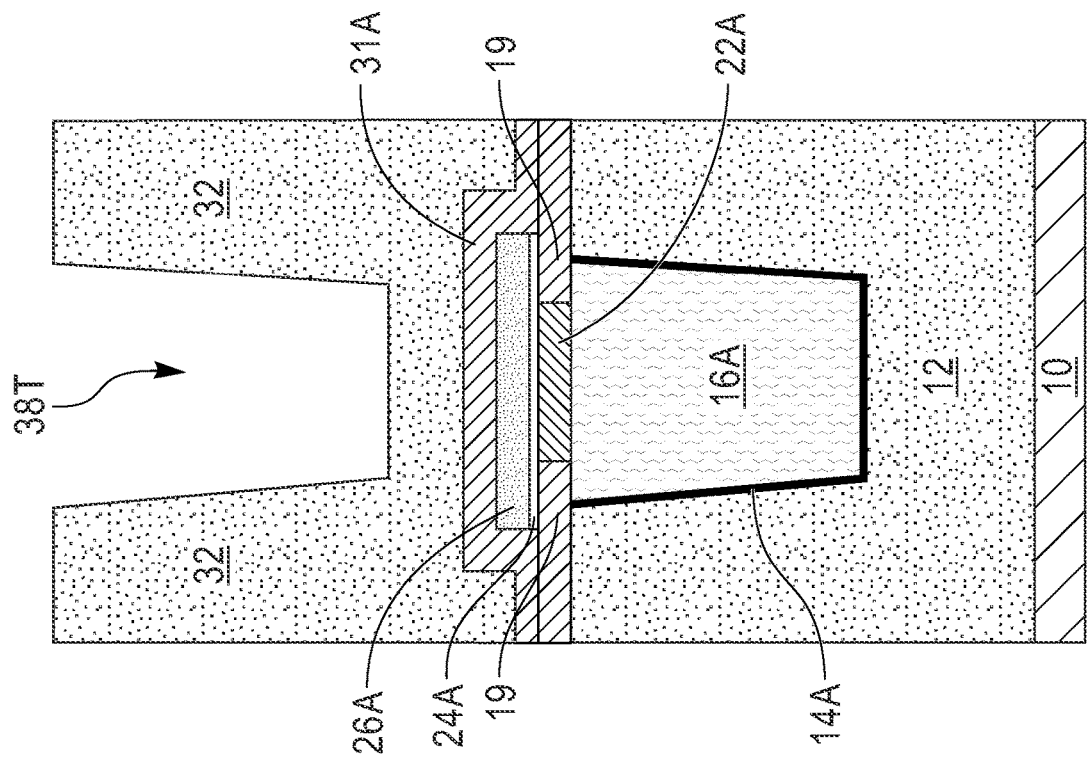
Figure 9C:
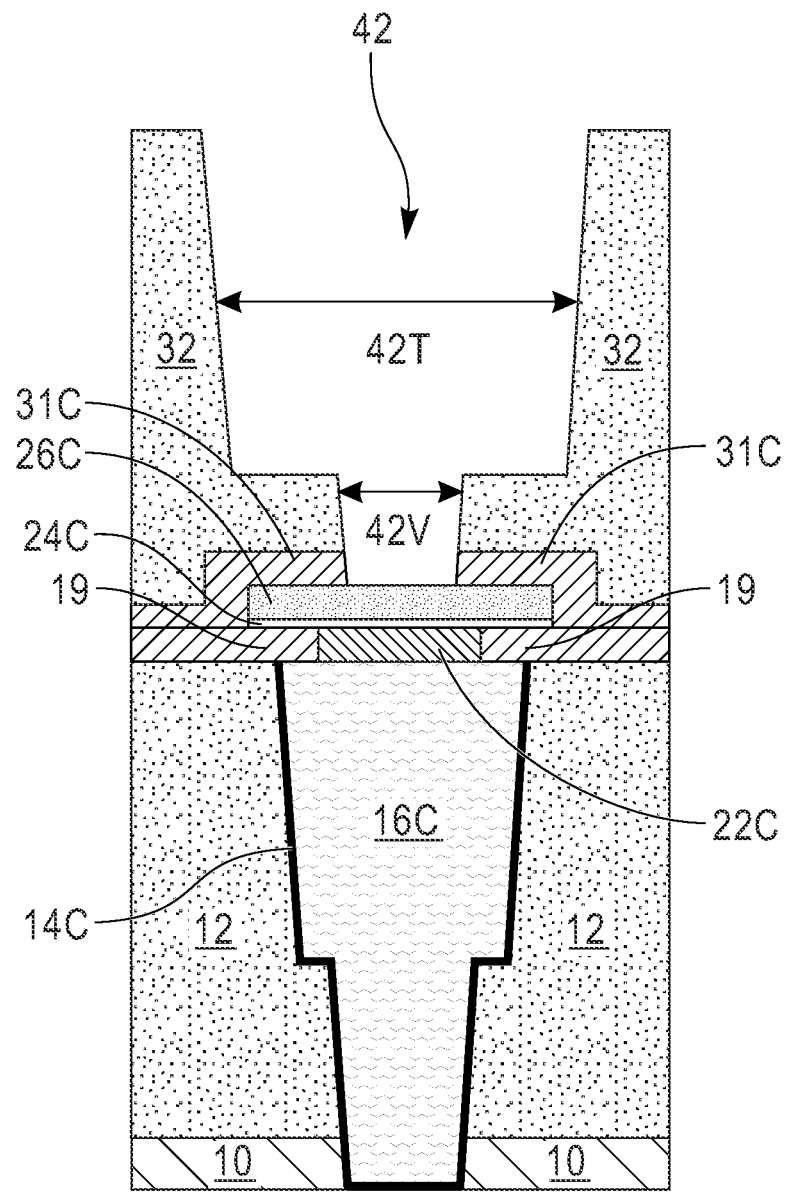
Figure 10C:
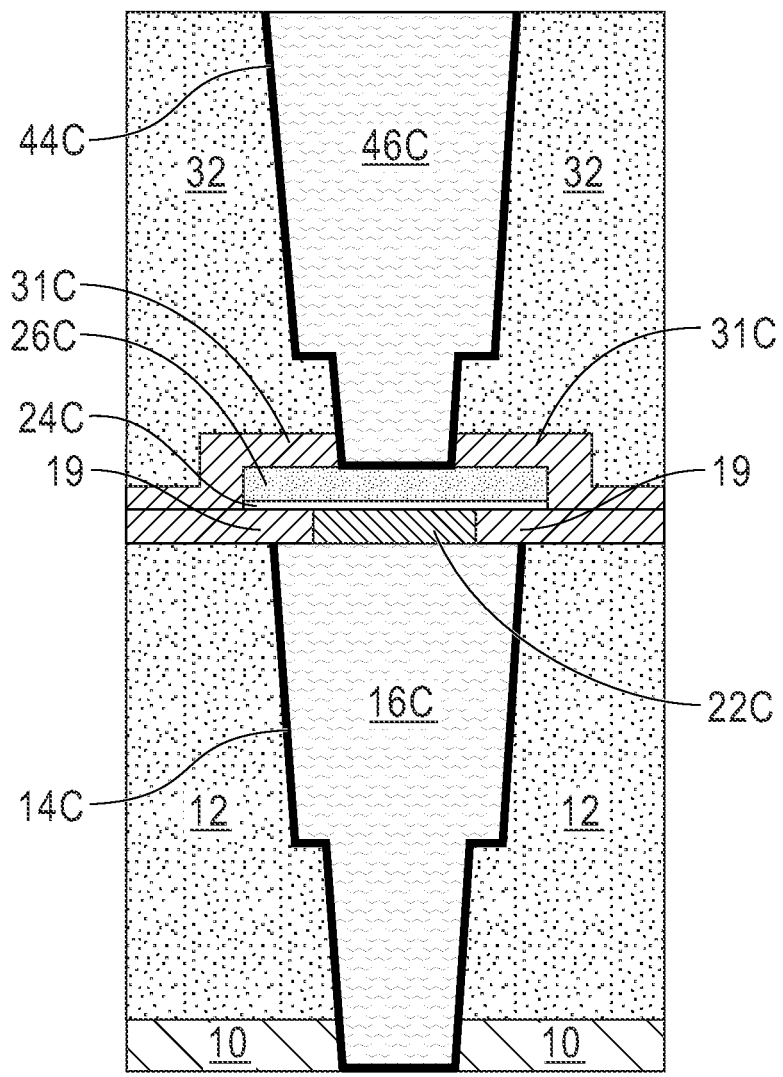

In one embodiment and as is shown in FIGS. 1A-10C, a top dual damascene contact structure (i.e., the ReRAM device area second electrically conductive structure 46C shown in FIG. 10C) including an upper trench portion and a lower via portion is provided in a ReRAM device area. The lower via portion of this top dual damascene contact structure contacts a top electrode of a ReRAM-containing structure. Also, and in the embodiment depicted in FIGS. 1A-10C, thickness matching between a dielectric capping layer and a hard mask cap is provided with dielectric encapsulation.

Referring now to FIGS. 1A, 1B and 1C, there are illustrated various areas (e.g., fill area as shown in FIG. 1A, logic device area as shown in FIG. 1B, and ReRAM device area as shown in FIG. 1C) of an exemplary structure after forming a bottom electrode opening 20 in a dielectric capping layer 18 that is present in both the fill area and ReRAM device area, but not the logic device area, wherein the dielectric capping layer 18 in each of the illustrated areas is on a surface of a fat level first interconnect dielectric material layer 12. Each of the fill area, the logic device area and the ReRAM device area is located laterally adjacent to each other (or in some instances farther away from each other), and each is at a same fat level of a BEOL structure. A lower level dielectric cap 10 can be located beneath the fat level first interconnect dielectric material layer 12 that is present in each of the various areas exemplified in the drawings of the present application.

As is shown in FIG. 1A, a fill area first electrically conductive structure 16A is embedded in the fat level first interconnect dielectric material layer 12 that is located in the fill area. The fill area first electrically conductive structure 16A extends partially through the fat level first interconnect dielectric material layer 12 that is present in the fill area and has a trench shape. As is also shown in FIG. 1A, a fill area first diffusion barrier liner 14A can be present along the sidewall and bottommost surface of the fill area first electrically conductive structure 16A. In some embodiments (not shown), the fill area first diffusion barrier liner 14A can be omitted from being present along the sidewall and bottommost surface of the fill area first electrically conductive structure 16A. As is shown, the bottom electrode opening 20 that is formed in the dielectric capping layer 18 that is present in the fill area physically exposes a surface of the fill area first electrically conductive structure 16A.

As is shown in FIG. 1B, a logic device area first electrically conductive structure 16B is embedded in the fat level first interconnect dielectric material layer 12 that is located in the logic device area. The logic device area first electrically conductive structure 16B extends entirely through the fat level first interconnect dielectric material layer 12 that is present in the logic device area and has a combined via/trench (i.e., a lower via portion and an upper trench portion) shape. In the present application a via has a first bottom width, and a trench has a second bottom width that is larger than the first width. In one example, the first bottom width is from 160 nm to 200 nm, and the second bottom width is from 180 nm to 220 nm. As is shown in FIG. 1B, the logic device area first electrically conductive structure 16B can also extend entirely through the lower level dielectric cap 10.

As is also shown in FIG. 1B, a logic device area first diffusion barrier liner 14B can be present along the sidewall and bottommost surface of the first logic area electrically conductive structure 16BA. In some embodiments (not shown), the logic device area first diffusion barrier liner 14B can be omitted from being present along the sidewall and bottommost surface of the logic device area first electrically conductive structure 16B. As is shown, no opening is formed in the dielectric capping layer 18 that is present in the logic device area.

As is shown in FIG. 1C, a ReRAM device area first electrically conductive structure 16C is embedded in the fat level first interconnect dielectric material layer 12 that is located in the ReRAM device area. The ReRAM device area first electrically conductive structure 16C extends entirely through the fat level first interconnect dielectric material layer 12 that is present in the ReRAM device area and has a combined via/trench shape. As is shown in FIG. 1C, the ReRAM device area first electrically conductive structure 16C can also extend entirely through the lower level dielectric cap 10.

As is also shown in FIG. 1C, a ReRAM device area first diffusion barrier liner 14C can be present along the sidewall and bottommost surface of the ReRAM device area first electrically conductive structure 16C. In some embodiments (not shown), the ReRAM device area first diffusion barrier liner 14C can be omitted from being present along the sidewall and bottommost surface of the ReRAM device area first electrically conductive structure 16C. As is shown, the bottom electrode opening 20 that is formed in the dielectric capping layer 18 that is present in the ReRAM device area physically exposes a surface of the ReRAM device area first electrically conductive structure 16C.

In accordance with an embodiment of the present application, the fill area first electrically conductive structure 16A, the logic device area first electrically conductive structure 16B, and the ReRAM device area first electrically conductive structure 16C have topmost surfaces that are coplanar with each and coplanar with a topmost surface of the fat level first interconnect dielectric material layer 12.

The exemplary structure shown in FIGS. 1A, 1B and 1C can be formed utilizing techniques that are well known to those skilled in the art. The most commonly used BEOL thin wire and fat wire level patterning scheme is a dual damascene process where via and trenches are formed with a via first or a trench first patterning process, metallization, and then removal of overburden material by chemical mechanical polishing (CMP). The first electrically conductive structures within the fill area, logic device area and the ReRAM device area can be formed simultaneously. The fill area first electrically conductive structure 16A can be formed during a trench opening process (via shape is not present in the fill area; thus, no via is formed during the via opening process in the fill area) into the fat level first interconnect dielectric material layer 12.

The logic device area first electrically conductive structure 16B, and the ReRAM device area first electrically conductive structure 16C can be formed with via first openings followed by trench openings over the vias (or trench openings first followed by via openings inside trench patterned hard mask) into the fat level first interconnect dielectric material layer 12. The combined via/trench opening and trench opening only (case of the fill area) is then filled with at least an electrically conductive material that provides the fill area first electrically conductive structure 16A, the logic device area first electrically conductive structure 16B and the ReRAM device area first electrically conductive structure 16C. In some embodiments, and prior to filling the combined via/trench opening with the electrically conductive material a diffusion barrier material is formed into the combined via/trench opening. A planarization process can follow the filling of the combined openings with the optionally diffusion barrier material and the electrically conductive material.

After forming the fill area first electrically conductive structure 16A, the logic device area first electrically conductive structure 16B and the ReRAM device area first electrically conductive structure 16C, dielectric capping layer 18 is formed by a deposition process such as, for example, chemical vapor deposition (CVD), plasma enhanced chemical vapor deposition (PECVD), physical vapor deposition (PVD) or atomic layer deposition (ALD). Lithography and etching can be used to form the bottom electrode opening 20 into the fill area and the ReRAM device area. Throughout this application, the term "lithography" denotes a process (i.e., lithographic process) in which a photoresist is applied to a material or material stack that needs to be patterned, the applied photoresist material is then subjected to a pattern of irradiation, and thereafter the exposed photoresist material is developed utilizing a resist developer. The etch used to define the bottom electrode opening 20 in both the fill area and the ReRAM device area of the fat level first interconnect dielectric material layer 12 includes a dry etching process such as, for example, reactive ion etching (RIE).

The lower level dielectric cap 10 is composed of a dielectric capping material including, but not limited to, silicon nitride ($Si_3N_4$), a nitrogen and hydrogen doped silicon carbide (SiC(N,H)) or a multilayered stack of at least one of the aforementioned dielectric capping materials. The dielectric capping material that provides the lower level dielectric cap 10 can be formed utilizing a deposition process such as, for example, CVD, PECVD, ALD, chemical solution deposition or evaporation.

The fat level first interconnect dielectric material layer 12 is typically a combination of undoped silicate glass (USG) and fluorosilicate glass (FSG). However, the fat level first interconnect dielectric material layer 12 can be composed of low-k dielectric (such as, for example, OMTS, OMCATS, TOMCATS, DMDMOS), by a chemical vapor deposition (CVD) low-k dielectric material or spin-on any combination thereof. The term "low-k" as used throughout the present application denotes a dielectric material that has a dielectric constant of less than 4.0. Illustrative low-k dielectric materials that can be used as the lower fat level interconnect dielectric material layer and/or upper non-fat level interconnect dielectric material layer include, but are not limited to, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The fat level first interconnect dielectric material layer 12 can be formed utilizing a deposition process including, for example, CVD, PECVD, evaporation or spin-on coating.

The fill area first diffusion barrier liner 14A, the logic device area first diffusion barrier liner 14B and the ReRAM device area first diffusion barrier liner 14C can be composed of any diffusion barrier material (i.e., a material that serves as a barrier to prevent a conductive material such as copper from diffusing there through). Examples of diffusion barrier materials that can be used in providing the fill area first diffusion barrier liner 14A, the logic device area first diffusion barrier liner 14B and the ReRAM device area first diffusion barrier liner 14C include, but are not limited to, Ta, TaN, Ti, TiN, Ru, RuN, RuTa, RuTaN, W, or WN; in some instances of the present application chemical symbols, as found in the Periodic Table of Elements, are used instead of the full names of the elements or compounds. In some embodiments, the diffusion barrier material can include a material stack of diffusion barrier materials. In one example, the diffusion barrier material can be composed of a stack of Ta/TaN for copper. Typically, the each of the fill area first diffusion barrier liner 14A, the logic device area first diffusion barrier liner 14B and the ReRAM device area first diffusion barrier liner 14C is composed of a same diffusion barrier material. The diffusion barrier layer can be formed by a deposition process such as, for example, CVD, PECVD, or PVD.

The fill area first electrically conductive structure 16A, the logic device area first electrically conductive structure 16B and the ReRAM device area first electrically conductive structure 16C are composed of an electrically conductive material such as, but not limited to, Cu, Al, W, Ru or any alloy thereof (i.e., a Cu—Al alloy). Typically, each of the fill area first electrically conductive structure 16A, the logic device area first electrically conductive structure 16B and the ReRAM device area first electrically conductive structure 16C is composed of a compositionally same electrically conductive material. The electrically conductive material can be formed by a deposition process such as, for example, CVD, PECVD, PVD, sputtering or electroplating. In some embodiments, a reflow anneal can follow the deposition of the electrically conductive material.

Dielectric capping layer 18 can be composed of one of the dielectric capping materials mentioned above for the lower level dielectric cap 10. The dielectric capping layer 18 can be formed utilizing one of the deposition processes mentioned above for the lower level dielectric cap 10. Dielectric capping layer 18 can have a thickness from 20 nm to 100 nm; although other thicknesses are contemplated and can be used in the present application as the thickness of the dielectric capping layer 18.

Figure 2B:
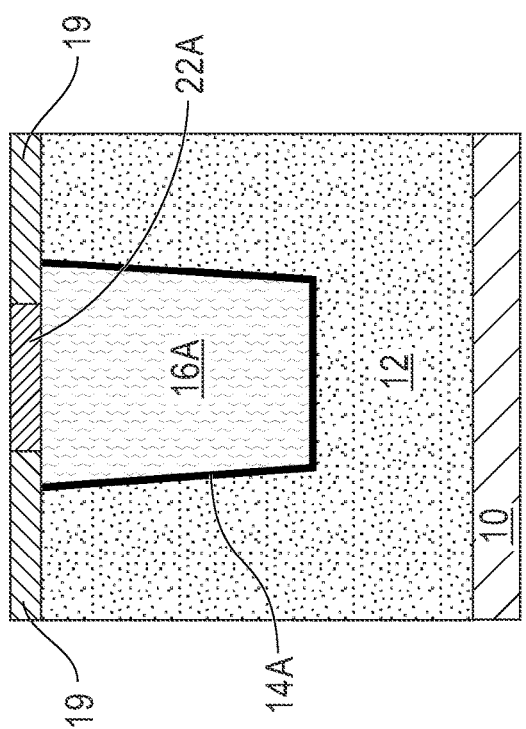
Figure 2C:
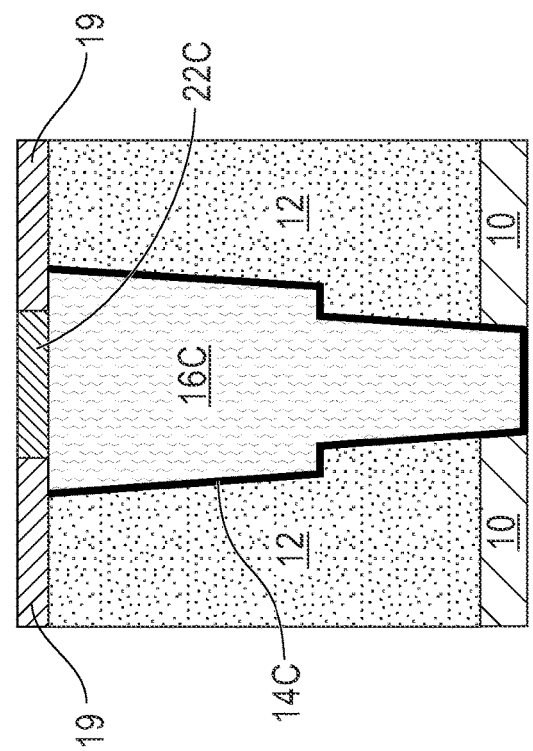

Referring now to FIGS. 2A, 2B and 2C, there are shown the exemplary structure shown in FIGS. 1A, 1B and 1C, respectively, after forming a bottom electrode in the bottom electrode opening 20 that is present in both the fill area and the ReRAM device area. The bottom electrode that is formed in the bottom electrode opening 20 that is present in the fill area can be referred to herein as fill area bottom electrode 22A, while the bottom electrode that is formed in the bottom electrode opening 20 that is present in the ReRAM device area can be referred to herein as a ReRAM device area bottom electrode 22C. Although not illustrated in this embodiment of the present application, and optional bottom electrode diffusion barrier liner and a base electrode can be formed (See, the embodiment illustrated in FIGS. 12A and 12C of the present application).

In the illustrated embodiment shown in FIGS. 2A and 2C, the fill area bottom electrode 22A is in direct physical contact, and forms an interface, with a surface of the fill area first electrically conductive structure 16A, and the ReRAM device area bottom electrode 22C is in direct physical contact, and forms an interface, with a surface of the ReRAM device area first electrically conductive structure 16C.

The fill area bottom electrode 22A and the ReRAM device area bottom electrode 22C are both composed of an oxygen deficient conductive material such as, for example, Ta, TaN, Ti, TiN, Ru, RuN, RuTa, RuTaN, Cu, Co, CoWP, CoN, W, WN or any combination thereof. The bottom electrode 22A is typically compositionally the same as the ReRAM device area bottom electrode 22C. The fill area bottom electrode 22A and the ReRAM device area bottom electrode 22C can have a thickness from 15 nm to 80 nm; other thicknesses are possible and can be used in the present application as the thickness of the fill area bottom electrode 22A and the ReRAM device are bottom electrode 22C. The fill area first electrically conductive structure 16A and the ReRAM device area first electrically conductive structure 16C typically have a width, i.e., critical dimension, that is greater than a width, i.e., critical dimension, of the fill area first electrically conductive structure 22A and the ReRAM device area bottom electrode 22C, respectively.

The fill area bottom electrode 22A and the ReRAM device area bottom electrode 22C can be formed by a deposition process such as, for example, CVD, ALD, PVD, electroplating, or electroless plating. A planarization process (such as, for example, CMP) typically follows the deposition of the conductive material that provides the fill area bottom electrode 22A and the ReRAM device area bottom electrode 22C. Note that during the forming of the bottom electrodes some thinning of the dielectric capping layer 18 can occur thus the thinned dielectric capping layer is labeled as 19 in the drawings of the present application. Typically, the fill area bottom electrode 22A has a topmost surface that is coplanar with a topmost surface of the ReRAM device area bottom electrode 22C, and both these bottom electrodes have a topmost surface that is typically coplanar with a topmost surface of the thinned dielectric capping layer 19.

Figure 3C:
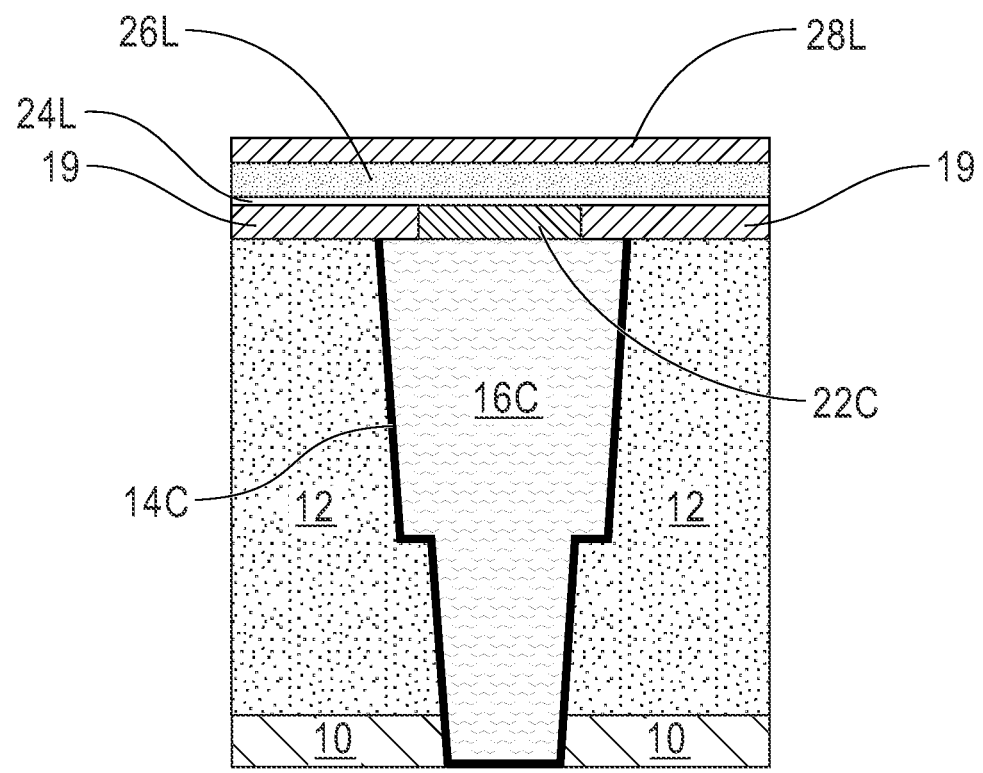

Referring now to FIGS. 3A, 3B and 3C, there are illustrated the exemplary structure shown in FIGS. 2A, 2B and 2C, respectively, after forming a ReRAM-containing material stack 24L/26L and a hard mask layer 28L in each of the fill area, the logic device area, and the ReRAM device area, the ReRAM-containing material stack 24L/26L includes a dielectric switching layer 24L and a top electrode layer 26L. As is shown, the ReRAM-containing material stack 24L/26L is present on both the fill area bottom electrode 22A and the ReRAM device area bottom electrode 22C as well as being present on the topmost surface of the thinned dielectric capping layer 19 in each of the fill area, the logic device area, and the ReRAM device area.

The dielectric switching layer 24L is electrically insulating at this point of the present application but can be subsequently converted into a filament that is electrically conducting. Examples of dielectric metal oxides that can be employed as the dielectric switching layer 24L include, but are not limited to, hafnium oxide ($HfO_x$), tantalum oxide ($TaO_x$), titanium oxide ($TiO_x$), aluminum oxide ($AlO_x$), silicon dioxide ($SiO_2$) or combinations thereof. In some embodiments, hydrogen can be present in the dielectric material that provides the dielectric switching layer 24L. The dielectric switching layer 24L can be formed utilizing a deposition process such as, for example, ALD, CVD, PECVD, or PVD. The dielectric switching layer 24L can have a thickness from 1 nm to 20 nm; other thicknesses however are contemplated can be used as the thickness of the dielectric switching layer 24L.

The top electrode layer 26L is in direct physical contact, and forms an interface, with the underlying dielectric switching layer 24L. The top electrode layer 26L can be composed of an oxygen scavenging material including, but not limited to, Ti, TiN, Ta, TaN, W or Al. In one embodiment, the top electrode layer 26L can be composed of a material that is compositionally the same as the oxygen deficient conductive material that provides the fill area bottom electrode 22A and/or the ReRAM device area bottom electrode 22C. The top electrode layer 26L can have a thickness from 10 nm to 100 nm; other thicknesses are possible and can be used in the present application as the thickness of the top electrode layer 26L. The top electrode layer 26L can be formed by a deposition process such as, for example, PVD, CVD, PECVD, or ALD.

The hard mask layer 28L can be composed of a dielectric hard mask material such as, for example, silicon nitride, silicon oxynitride or any combination thereof. The hard mask layer 28L can be formed utilizing a deposition process such as, for example, CVD, PECVD, ALD, chemical solution deposition or evaporation, followed by patterning. The hard mask layer 28L can have a thickness from 20 nm to 100 nm; other thicknesses however are contemplated can be used as the thickness of the hard mask layer 28L. The thickness of hard mask will be determined by loss of hard mask during patterning process.

Figure 4C:
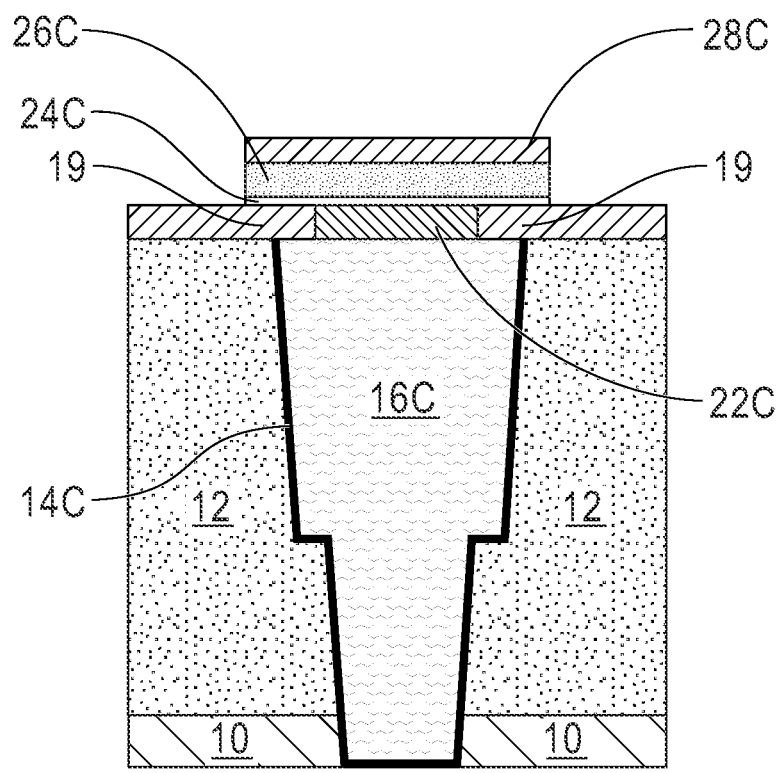

Referring now to FIGS. 4A, 4B and 4C, there are illustrated the exemplary structure shown in FIGS. 3A, 3B and 3C, respectively, after patterning the dielectric hard mask layer 28L and the ReRAM-containing material stack 24L/26L to provide a dielectric hard mask capped ReRAM-containing structure in each of the fill area and the ReRAM device area, while entirely removing the dielectric hard mask layer 28L and the ReRAM-containing material stack 24L/26L that is present in the logic device area. During patterning of the dielectric hard mask layer 28L, some thinning of the dielectric hard mask layer 28L typically occurs.

Patterning of the dielectric hard mask layer 28L and the ReRAM-containing material stack 26L/24L includes lithography and etching. The lithographic step protects a portion of the hard mask layer 28L that is present in each of the fill area and the ReRAM device area, while leaving other portions of the hard mask layer present in the fill area and the ReRAM device area and the entirety of the dielectric hard mask layer 28L present in the logic device area unprotected. The etch process removes the unprotected portion of the hard mask layer 26L as well as the ReRAM-containing material stack 24L/26L that is present in each of the fill area, the logic device area and the ReRAM device area that are not protected. The etching can include one or more dry etching and/or wet etching processes.

The dielectric hard mask capped ReRAM-containing structure that is present in the fill area includes a remaining portion of the hard mask layer 28L and a remaining portion of the ReRAM-containing material stack 24L/26L. The remaining portion of the hard mask layer 28L in the fill area can be referred to as a fill area hard mask 28A, while the remaining portion of the ReRAM-containing material stack 24L/26L in the fill area can be referred to as a fill area ReRAM-containing stack 24A/26A. The fill area ReRAM-containing stack 24A/26A includes a remaining portion of the top electrode layer 26L (hereinafter referred to a fill area top electrode 26A) and a remaining portion of the dielectric switching layer 24L (hereinafter referred to as a fill area dielectric switching layer 24A). As is shown in FIG. 4A, the fill area hard mask 28A has an outermost surface that is vertically aligned with an outermost surface of both the fill area top electrode 26A and the fill area dielectric switching layer 24A. As is further shown in FIG. 4A, the fill area ReRAM-containing stack 24A/26A has a width, i.e., critical dimension, that is greater than a width, i.e., critical dimension, of the underlying fill area bottom electrode 22A. As is even further shown in FIG. 4A, the fill area ReRAM-containing stack 24A/26A is present on a topmost surface of the fill area bottom electrode 22A as well as a topmost surface of the thinned dielectric capping layer 19 that is present in the fill area. The fill area ReRAM-containing stack 24A/26A is a non-active ReRAM-containing stack.

The dielectric hard mask capped ReRAM-containing structure that is present in the ReRAM device area includes another remaining portion of the hard mask layer 28L and another remaining portion of the ReRAM-containing material stack 24L/26L. This remaining portion of the hard mask layer 28L in the ReRAM device area can be referred to as a ReRAM device area hard mask 28C, while this remaining portion of the ReRAM-containing material stack 24L/26L in the ReRAM device area can be referred to as a ReRAM device area ReRAM-containing stack 24C/26C. The ReRAM device area ReRAM-containing stack 24C/26C includes a remaining portion of the top electrode layer 26L (hereinafter referred to a ReRAM device area top electrode 26C) and a remaining portion of the dielectric switching layer 24L (hereinafter referred to as a ReRAM device area dielectric switching layer 24C). As is shown in FIG. 4C, the ReRAM device area hard mask 28C has an outermost surface that is vertically aligned with an outermost surface of both the ReRAM device area top electrode 26C and the ReRAM device area dielectric switching layer 24C. As is further shown in FIG. 4C, the ReRAM device area ReRAM-containing stack 24C/26C has a width, i.e., critical dimension, that is greater than a width, i.e., critical dimension, of the underlying ReRAM device area bottom electrodes 22C. As is even further shown in FIG. 4C, the ReRAM device area ReRAM-containing stack 24C/26C is present on a topmost surface of both ReRAM device area bottom electrodes 22C as well as a topmost surface of the thinned dielectric capping layer 19 that is present in the ReRAM device area.

It is noted that during this patterning step of the present application, the thickness of the remaining portions of the hard mask layer 28L (i.e., the fill area hard mask 28A and ReRAM device area hard mask 28C) has been reduced from its original thickness to a thickness that is substantially the same (i.e., within ±10%) as the thickness of the thinned dielectric capping layer 19. In one example, the reduced thickness of the fill area hard mask 28A and ReRAM device area hard mask 28C can be from 15 nm to 50 nm.

Figure 5C:
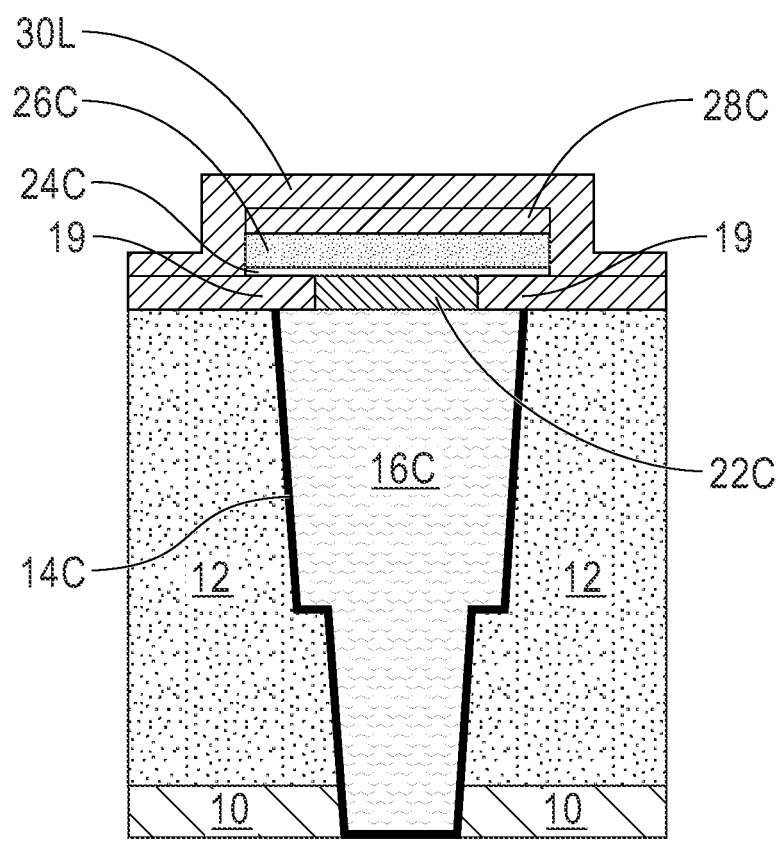

Referring now to FIGS. 5A, 5B and 5C, there are illustrated the exemplary structure shown in FIGS. 4A and 4C, respectively, after forming a dielectric encapsulation layer 30L in each of the fill area, the logic device area and the ReRAM device area. The dielectric encapsulation layer 30L can include one of the dielectric hard mask materials mentioned above for the dielectric hard mask layer 28L. The dielectric encapsulation layer 30L can be composed of a compositionally same, or compositionally different, dielectric hard mask material as the dielectric hard mask layer 28L. The dielectric encapsulation layer 30L can be formed utilizing a deposition process such as, for example, ALD, CVD, or PECVD. The dielectric encapsulation layer 30L can have a thickness from 5 nm to 50 nm; although other thicknesses are possible and can be used in the present application as the thickness of the dielectric encapsulation layer 30L. The dielectric encapsulation layer 30L can be a conformal dielectric material layer. By "conformal" it is meant that a material layer has a vertical thickness along horizontal surfaces that is substantially the same (i.e., within ±10%) as the lateral thickness along vertical surfaces.

It is noted that within this fat wire level there is sufficient area to form a dielectric encapsulation layer 30L, and that in this embodiment no spacer etch back process is required to form the dielectric encapsulation layer 30L. As is shown, the dielectric encapsulation layer 30L encapsulates the dielectric hard mask capped ReRAM-containing structure that is present in each of the fill area and the ReRAM device area. The thickness of the dielectric encapsulation layer 28A and thinned dielectric capping layer 19 are the same (i.e., within ±15%). Therefore, the total thickness of the dielectric encapsulation layer 30L and the fill area hard mask 28A as well as the total thickness of the dielectric encapsulation layer 30L and the ReRAM hard mask 28C that is above ReRAM stack are the same as the total thickness of the dielectric encapsulation layer 30L and thinned dielectric capping layer 19 in the field area. This total thickness of the dielectric encapsulation layer 30L and thinned dielectric capping layer 19 in the field area should match with the dielectric capping layer required for this particular fat wire level process assumption. The key reason is to have a nitride punch through process open both the lower via contact for ReRAM-containing stack and lower via contact in the logic device area which will be explained in FIGS. 9A, 9B and 9C below.

Figure 6C:
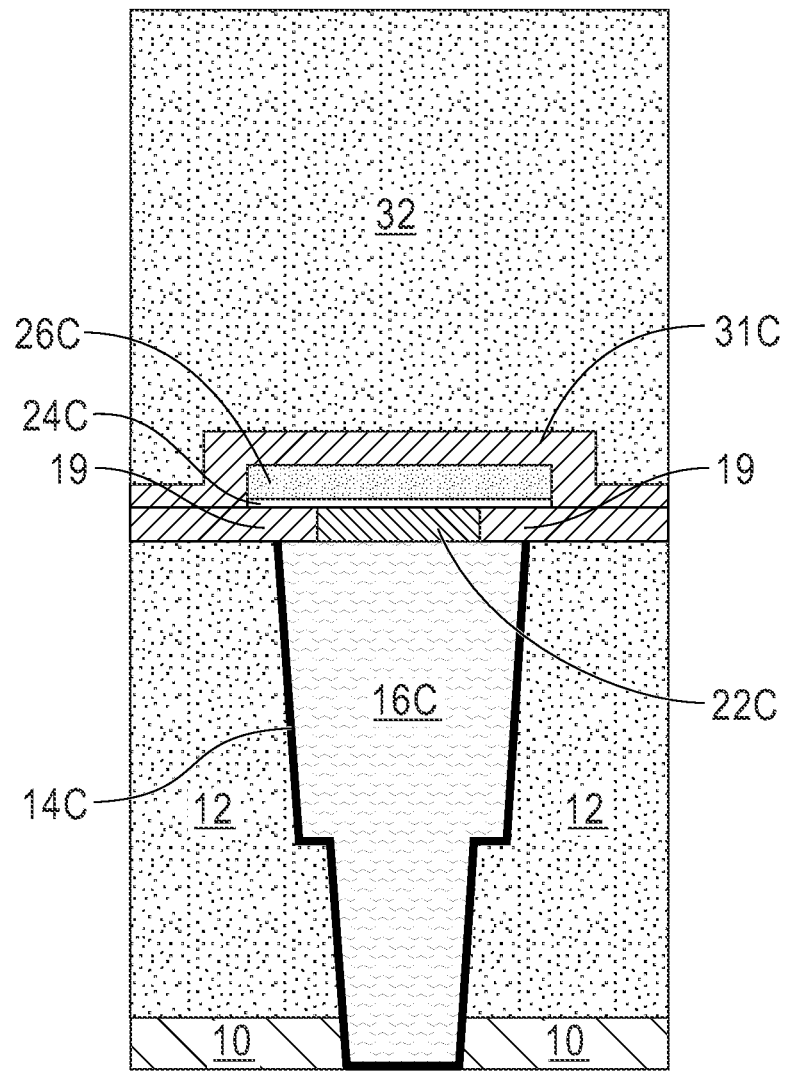

Referring now to FIGS. 6A, 6B and 6C, there are illustrated the exemplary structure shown in FIGS. 5A, 5B and 5C, respectively, after forming a fat level second interconnect dielectric material layer 32 on the dielectric encapsulation layer 30L in each of the fill area, the logic device area and the ReRAM device area. As is shown in FIG. 6A and within the fill area, the dielectric encapsulation layer 30L and the fill area dielectric mask 28A can be collectively referred to as a fill area dielectric encapsulation structure 31A. Likewise, and as shown within the ReRAM device area of FIG. 6C the dielectric encapsulation layer 30L and the ReRAM device area dielectric mask 28C can be collectively referred to as a ReRAM device area dielectric encapsulation structure 31C.

The fat level second interconnect dielectric material layer 32 includes one of the dielectric materials mentioned above for fat level first interconnect dielectric material layer 12. The fat level second interconnect dielectric material layer 32 can be compositionally the same as, or compositionally different from, the fat level first interconnect dielectric material layer 12. The fat level second interconnect dielectric material layer 32 can be formed utilizing one of the deposition processes mentioned above for forming the fat level first interconnect dielectric material layer 12. It is noted that since the ReRAM device area ReRAM-containing stack 24C/26C in the fat wire level is not tall, gap fill is not a challenge. After depositing the fat level second interconnect dielectric material layer 32, CMP can be applied to remove topography which is coming from the ReRAM-containing stacks.

Figure 7C:
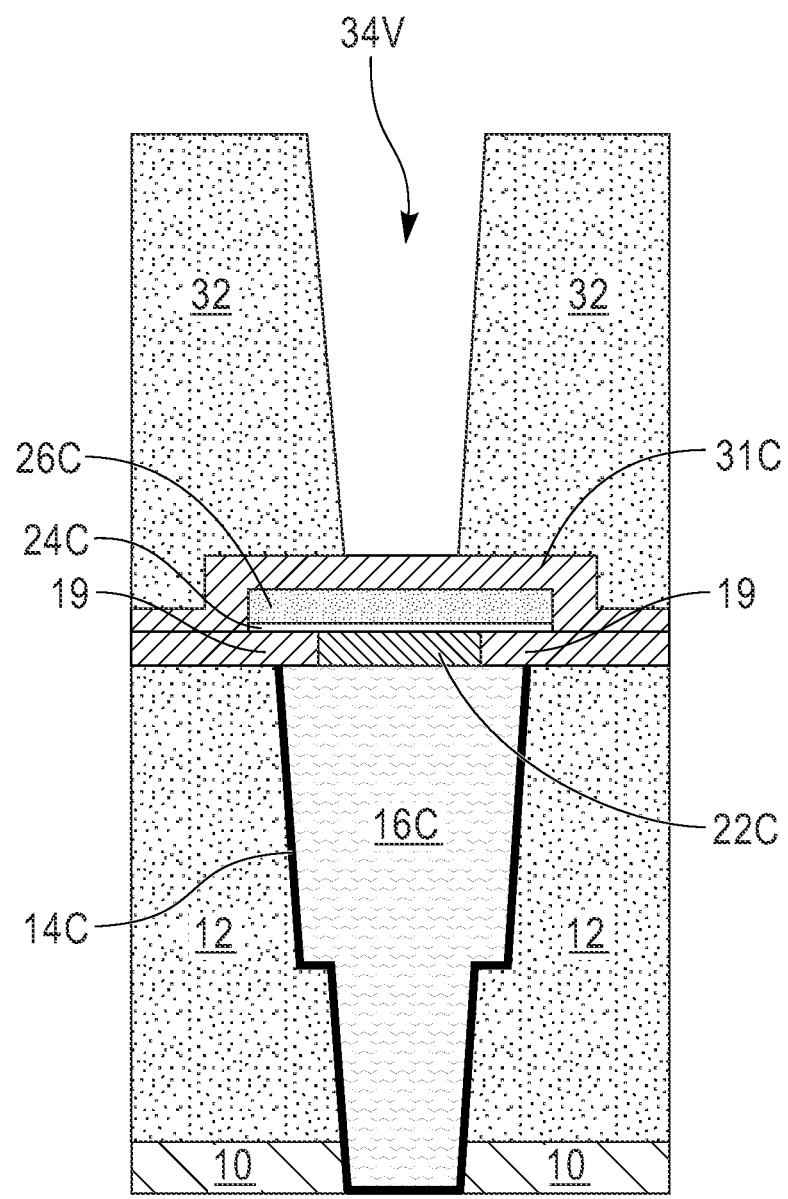

Referring now to FIGS. 7A, 7B and 7C, there are illustrated the exemplary structure shown in FIGS. 6A, 6B and 6C, respectively, after forming a ReRAM contact via 34V in the fat level second interconnect dielectric material layer 32 that is present in the ReRAM device area. No openings are formed in the fat level second interconnect dielectric material layer 32 that is present in the fill area or the logic device area during the formation of the ReRAM contact via 34V. The ReRAM contact via 34V can be formed by lithography and etching. The etch can include a dry etching process that stops on the ReRAM device area dielectric encapsulation structure 31C that is present on the ReRAM device area ReRAM-containing stack 24C/26C.

The ReRAM contact via 34V that is formed in the fat level second interconnect dielectric material layer 32 that is present in the ReRAM device area extends entirely through the fat level second interconnect dielectric material layer 32 and physically exposes a topmost surface of the ReRAM device area dielectric encapsulation structure 31C that is present on the ReRAM device area ReRAM-containing stack 24C/26C. The ReRAM contact via 34V can have entirely perpendicular sidewalls, relative to the topmost surface of the ReRAM device area dielectric encapsulation structure 31C, or the ReRAM contact via 34V can have tapered sidewalls.

Figure 8B:
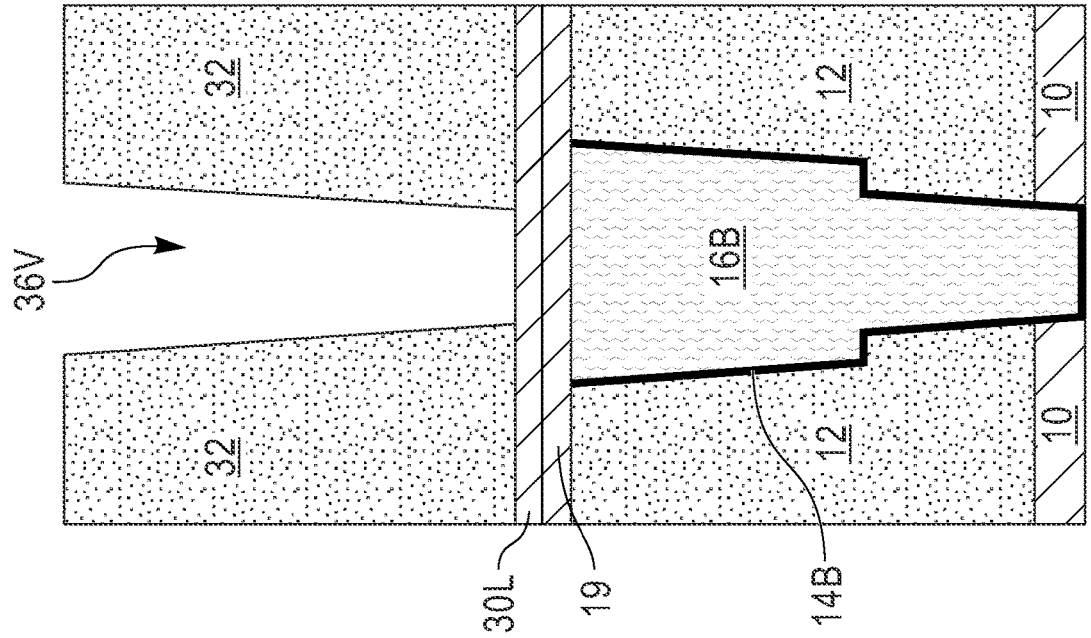
FIGS. 8A, 8B and 8C are cross sectional views of the exemplary structure shown in FIGS. 7A, 7B and 7C, respectively, forming a logic device contact via in the fat level second interconnect dielectric material layer that is present in the logic device area.
Figure 8A:
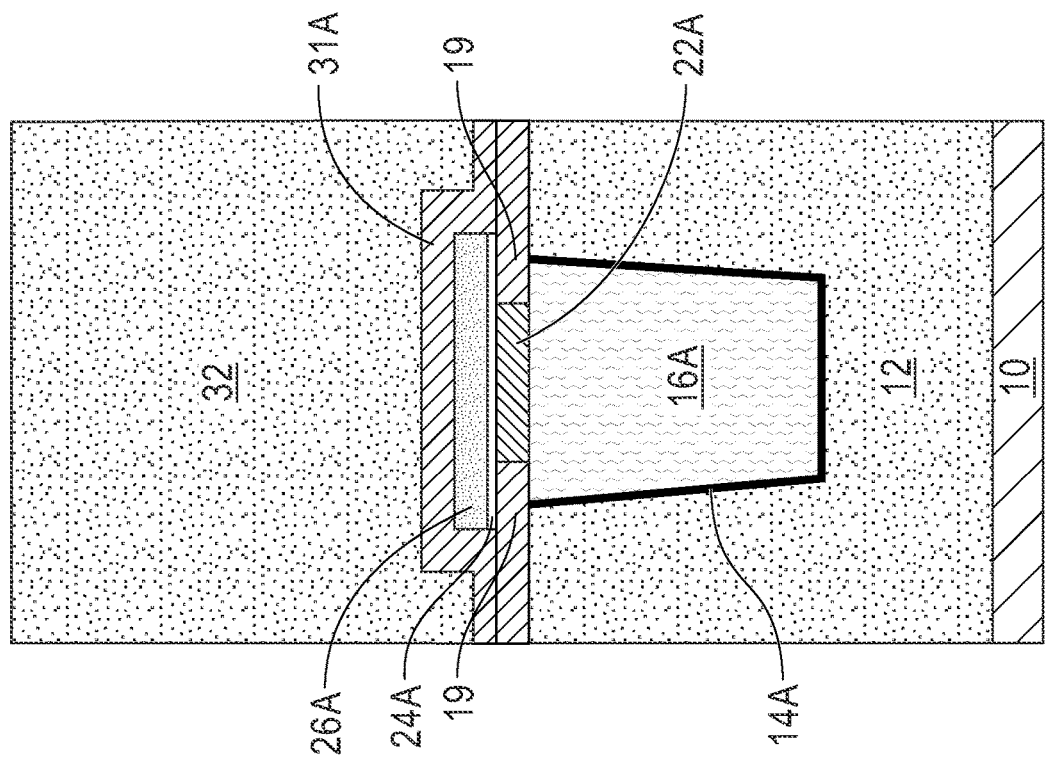
Figure 8C:
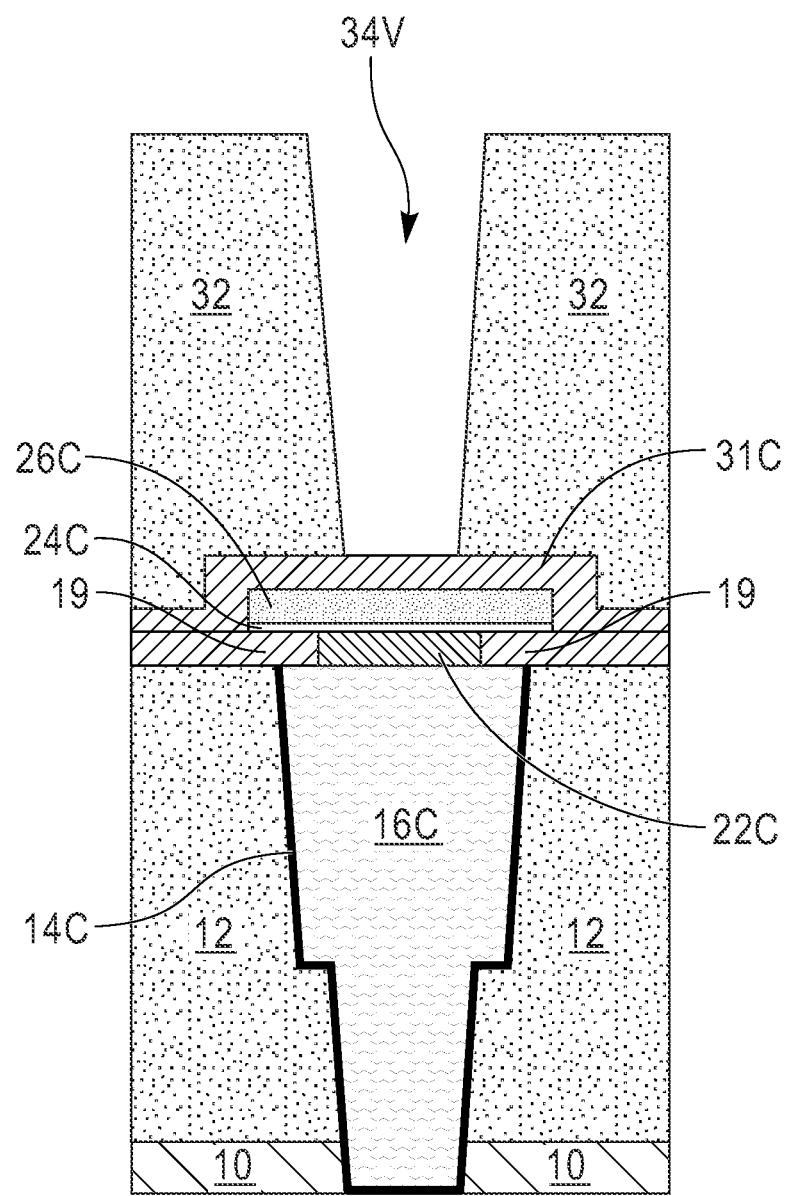

Referring now to FIGS. 8A, 8B and 8C, there are illustrated the exemplary structure shown in FIGS. 7A, 7B and 7C, respectively, forming a logic device contact via 36V in the fat level second interconnect dielectric material layer 32 that is present in the logic device area. Before forming logic device contact via 36V in FIG. 8B, the ReRAM contact via 34V in FIG. 7C can be filled with an organic planarization layer (OPL) and is thus protected. A patterning process to open the logic device contact via 36V in the logic device area is then performed in FIG. 8B. The OPL can be removed from the ReRAM contact via 34V after forming the logic device contact via 36V. No openings are formed in the fat level second interconnect dielectric material layer 32 that is present in the fill area or the ReRAM device area during the formation of the logic device contact via 36V. Also, no etching of the physically exposed ReRAM device area dielectric encapsulation structure 31C that is present on the ReRAM device area ReRAM-containing stack 24C/26C occurs during the formation of the logic device contact via 36V.

The logic device contact via 36V can be formed by lithography and etching. The etch can include a dry etching process or a chemical wet etch that stops on either the dielectric passivation layer 30L or the thinned dielectric capping layer 19 that is present in the logic device area. FIG. 8B illustrates an embodiment in which the etch used in forming the logic device contact via stops on a surface of the dielectric passivation layer 30L that is present in the logic device area.

The logic device contact via 36V that is formed extends entirely through the fat level second interconnect dielectric material layer 32 and physically exposes a surface of either the dielectric passivation layer 30L or the thinned dielectric capping layer 19 that is present in the logic device area. The logic device contact via 36V can have entirely perpendicular sidewalls, relative to the topmost surface of either the dielectric passivation layer 30L or the thinned dielectric capping layer 19 that is present in the logic device area, or the logic device contact via 36V can have tapered sidewalls. The remaining total thickness of the dielectric encapsulation layer 31L and the trimmed dielectric capping layer 19 below the bottom of the logic device contact via 36V and that of the ReRAM device area dielectric encapsulation structure 31C below the bottom of ReRAM contact via 34V are the same (i.e., within 15%).

Referring now to FIGS. 9A, 9B and 9C, there are illustrated the exemplary structure shown in FIGS. 8A, 8B and 8C after forming a contact trench in the fat level second interconnect dielectric material layer 32 that is present in each of the fill area, the logic device area and the ReRAM device area.

The contact trenches can be formed by lithography and etching for all areas, i.e., fill area, logic device area, and ReRAM device area simultaneously. The ReRAM device via 34V and the logic device contact via 36V are filled with OPL and protected during the trench patterning process. Trench lithography is performed over the OPL. The trench lithography stack can include hard mask and resist. The trench lithography process can generate a trench pattern in a resist stack. The plasma etch form the trenches in the fat level second dielectric material layer 32 and thereafter the OPL is removed from ReRAM device via 34V and the logic device contact via 36V. A separate etch (e.g., a nitride punch through etch for the ReRAM device area encapsulation structure 31C and the dielectric encapsulation layer 30L+ trimmed dielectric capping layer 19) can be performed in the logic device area and the ReRAM device area. Since the thickness of the ReRAM device area encapsulation structure 31C and the dielectric encapsulation layer 30L+trimmed dielectric capping layer 19 are the same, the punch through etch in the logic device area physically exposes a portion of the underlying first logic device electrically conductive structure 16B, while the punch through etch physically exposes the top electrode 26C in the ReRAM device area.

The contact trench that is formed in the fill area can be referred to as a fill area contact trench 38T. As is shown in FIG. 9A, the fill area contact trench 38T extends only partially through the fat level second interconnect dielectric material layer 32 and thus remains spaced apart from the underlying fill area ReRAM-containing stack 24A/26A by a remaining portion of the fat level second interconnect dielectric material layer 32 and the fill area encapsulation layer 31A. The fill area contact trench typically has tapered sidewalls as illustrated in FIG. 9A.

The contact trench that is formed in the logic device area can be referred to as a logic device area contact trench 40T, which is located above and in communication with a logic device area extended via 40V. The logic device area extended via 40V includes a lower portion of the logic device area via 36V and the punch through area. Collectively, the logic device area contact trench 40T and the logic device area extended via 40V provide a combined logic device area contact opening 40 that physically exposes a surface of the logic device area first electrically conductive structure 16B.

The contact trench that is formed in the ReRAM device area can be referred to as a ReRAM device area contact trench 42T, which is located above and in communication with a ReRAM device area extended via 42V. The ReRAM device area extended via 42V includes a lower portion of the ReRAM device area via 34V and the punch through area. Collectively, the ReRAM device area contact trench 42T and the ReRAM device area extended via 42V provide a combined ReRAM device area contact opening 42 that physically exposes a surface of the top electrode 26C as is shown in FIG. 9C.

Referring now to FIGS. 10A, 10B and 10C, there are illustrated the exemplary structure of FIGS. 9A, 9B and 9C after forming a contact structure in the fat level second interconnect dielectric material layer 32 that is present in each of the fill area, the logic device area and the ReRAM device area.

Notably, a contact structure is formed in the fill area contact trench 38T. The contact structure that is formed in the fill area contact trench 38T can be referred to as a fill area contact structure. The fill area contact structure, which is shown in FIG. 10A, includes an optional fill area second diffusion barrier liner 44A and a fill area second electrically conductive structure 46A. As is shown in FIG. 10A, the fill area second electrically conductive structure 46A has a trench shape and a topmost surface that is coplanar with at least a topmost surface of the fat level second interconnect dielectric material layer 32. When the fill area second diffusion barrier liner 44A is present, the fill area second electrically conductive structure 46A has a topmost surface that is coplanar with a topmost surface of both the fill area second diffusion barrier liner 44A and the fat level second interconnect dielectric material layer 32. When present, the fill area second diffusion barrier liner 44A is present along the sidewall and bottommost surface of the fill area second electrically conductive structure 46A.

A contact structure is also formed in combined logic device area contact opening 40. The contact structure that is formed in the combined logic device area contact opening 40 can be referred to as a logic device area contact structure. The logic device area contact structure, which is shown in FIG. 10B, includes an optional logic device area second diffusion barrier liner 44B and a logic device area second electrically conductive structure 46B. As is shown in FIG. 10B, the logic device area second electrically conductive structure 46B has a combined via and trench shape and a topmost surface that is coplanar with at least a topmost surface of the fat level second interconnect dielectric material layer 32. The via portion of the logic device area second electrically conductive structure 46B is located beneath the trench portion of the logic device area second electrically conductive structure 46B. When the logic device area second diffusion barrier liner 44B is present, the logic device area second electrically conductive structure 46B has a topmost surface that is coplanar with a topmost surface of both the logic device area second diffusion barrier liner 44B and the fat level second interconnect dielectric material layer 32. When present, the logic device area second diffusion barrier liner 44B is present along the sidewall and bottommost surface of the logic device area second electrically conductive structure 46B. The logic device area contact structure including at least the logic device area second electrically conductive structure 46B is in electrical contact with the underlying logic device area first electrically conductive structure 16B.

A contact structure is also formed in combined ReRAM device area contact opening 42. The contact structure that is formed in the combined ReRAM device area contact opening 42 can be referred to as a ReRAM device area contact structure. The ReRAM device area contact structure, which is shown in FIG. 10C, includes an optional ReRAM device area second diffusion barrier liner 44C and a ReRAM device area second electrically conductive structure 46C. As is shown in FIG. 10C, the ReRAM device area second electrically conductive structure 46C has a combined via and trench shape and a topmost surface that is coplanar with at least a topmost surface of the fat level second interconnect dielectric material layer 32. The via portion of the ReRAM device area second electrically conductive structure 46C is located beneath the trench portion of the ReRAM device area second area electrically conductive structure 46C. When the ReRAM device area second diffusion barrier liner 44C is present, the ReRAM device area second electrically conductive structure 46C has a topmost surface that is coplanar with a topmost surface of both the ReRAM device area second diffusion barrier liner 44C and the fat level second interconnect dielectric material layer 32. When present, the ReRAM device area second diffusion barrier liner 44C is present along the sidewall and bottommost surface of the ReRAM device area second electrically conductive structure 46C. The ReRAM device area contact structure including at least the ReRAM device area second electrically conductive structure 46C is in electrical contact with the underlying top electrode 26C of the ReRAM device area ReRAM-containing stack 24C/26C.

The fill area second diffusion barrier liner 44A, the logic device area second diffusion barrier liner 44B and the ReRAM device area second diffusion barrier liner 44C can be composed of one of the diffusion barrier materials mentioned above for the fill area first diffusion barrier liner 14B, logic device area first diffusion barrier liner 14B, and the ReRAM device area diffusion barrier layer 14C.

The fill area second electrically conductive structure 46A, the logic device area second electrically conductive structure 46B and the ReRAM device area second electrically conductive structure 46C can be composed of one of the conductive materials mentioned above for the fill area first electrically conductive structure 16A, the logic device area first electrically conductive structure 16B and the ReRAM device area first electrically conductive structure 16C.

Each contact structure including at least the fill area second electrically conductive structure 46A, the logic device area second electrically conductive structure 46B and the ReRAM device area second electrically conductive structure 46C can be formed utilizing the technique mentioned for forming the first electrically conductive structures.

In another embodiment and as is shown in FIGS. 11A-19C, a tall bottom electrode is formed in each of the fill area, logic device area and the ReRAM device area. The tall bottom electrode in the ReRAM device area raises the height of the ReRAM device without any gap fill issues. The tall bottom electrode can include a bottom electrode located on a base electrode, or the tall bottom electrode can consist entirely of a bottom electrode.

Figure 11C:
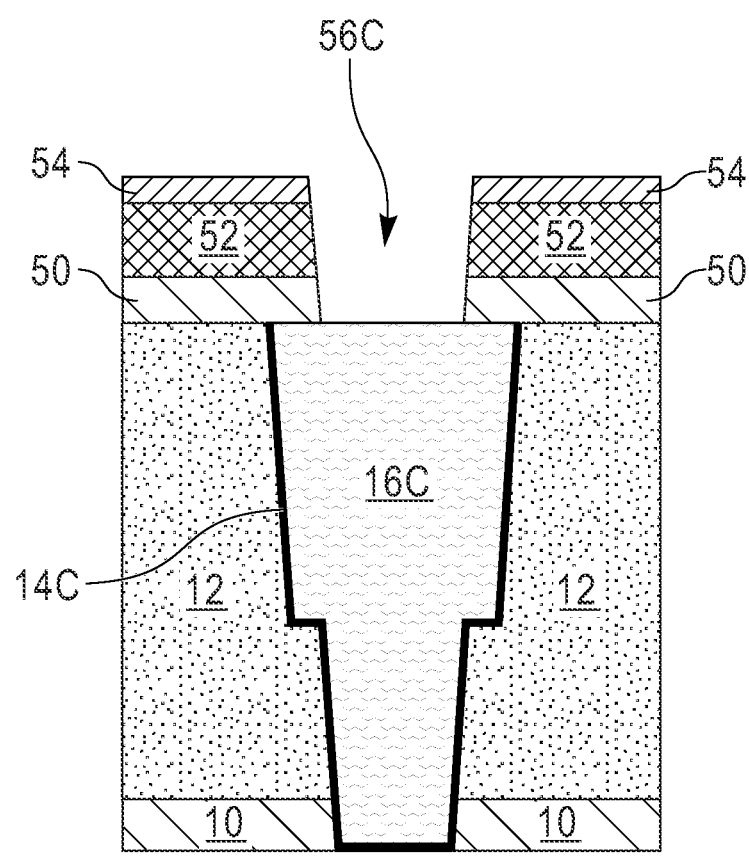

Referring now to FIGS. 11A, 11B and 11C, there are illustrated various areas (e.g., fill area as shown in FIG. 11A, logic device area as shown in FIG. 11B, and ReRAM device area as shown in FIG. 11C) of an exemplary structure after forming a bottom electrode opening in a dielectric material stack 50/52/54 that is present in both the fill area and ReRAM device area, but not the logic device area, wherein the dielectric material stack 50/52/54 in each of the illustrated areas is on a surface of a fat level first interconnect dielectric material layer 12. Each of the fill area, the logic device area and the ReRAM device area is located laterally adjacent to, or far away from, each other, and each is at a same fat level of a BEOL structure. Lower level dielectric cap 10 can be located beneath the fat level first interconnect dielectric material layer 12 that is present in each of the various areas exemplified in the drawings of the present application.

As is shown in FIG. 11A, and within the fat level first interconnect dielectric material layer 12 that is present in the fill area, a fill area first electrically conductive structure 16A is embedded in the fat level first interconnect dielectric material layer 12 that is located in the fill area. The fill area first electrically conductive structure 16A extends partially through the fat level first interconnect dielectric material layer 12 that is present in the fill area and has a trench shape. As is also shown in FIG. 11A, a fill area first diffusion barrier liner 14A can be present along the sidewall and bottommost surface of the fill area first electrically conductive structure 16A. In some embodiments (not shown), the fill area first diffusion barrier liner 14A can be omitted from being present along the sidewall and bottommost surface of the fill area first electrically conductive structure 16A.

As is shown in FIG. 11B, and within the fat level first interconnect dielectric material layer 12 that is present in the logic device area, a logic device area first electrically conductive structure 16B is embedded in the fat level first interconnect dielectric material layer 12 that is located in the logic device area. The logic device area first electrically conductive structure 16B extends entirely through the fat level first interconnect dielectric material layer 12 that is present in the logic area and has a combined via/trench (i.e., a lower via portion and an upper trench portion) shape. As is shown in FIG. 11B, the logic device area first electrically conductive structure 16B can also extend entirely through lower level dielectric cap 10.

As is also shown in FIG. 11B, a logic device area first diffusion barrier liner 14B can be present along the sidewall and bottommost surface of the first logic area electrically conductive structure 16B. In some embodiments (not shown), the logic device area first diffusion barrier liner 14B can be omitted from being present along the sidewall and bottommost surface of the logic device area first electrically conductive structure 16B. As is shown, no opening is formed in the dielectric capping layer 18 that is present in the logic device area.

As is shown in FIG. 11C, and within the fat level first interconnect dielectric material layer 12 that is present in the ReRAM device area, a ReRAM device area first electrically conductive structure 16C is embedded in the fat level first interconnect dielectric material layer 12 that is located in the ReRAM device area. The ReRAM device area first electrically conductive structure 16C extends entirely through the fat level first interconnect dielectric material layer 12 that is present in the ReRAM device and has a combined via/trench shape. As is shown in FIG. 11C, the ReRAM device area first electrically conductive structure 16C can also extend entirely through lower level dielectric cap 10.

As is also shown in FIG. 11C, a ReRAM device area first diffusion barrier liner 14C can be present along the sidewall and bottommost surface of the ReRAM device area first electrically conductive structure 16C. In some embodiments (not shown), the ReRAM device area first diffusion barrier liner 14C can be omitted from being present along the sidewall and bottommost surface of the ReRAM device area first electrically conductive structure 16C. As is shown, the bottom electrode opening 20 that is formed in the dielectric capping layer 18 that is present in the ReRAM device area physically exposes a surface of the ReRAM device area first electrically conductive structure 16C.

In accordance with an embodiment of the present application, the fill area first electrically conductive structure 16A, the logic device area first electrically conductive structure 16B, and the ReRAM device area first electrically conductive structure 16C have topmost surfaces that are coplanar with each and coplanar with a topmost surface of the fat level first interconnect dielectric material layer 12.

Each of the lower level dielectric cap 10, the fat level first interconnect dielectric material layer 12, the fill area first diffusion barrier liner 14A, the logic device area first diffusion barrier liner 14B, the ReRAM device area first diffusion barrier liner 14C, the fill area first electrically conductive structure 16A, the logic device area first electrically conductive structure 16B, and the ReRAM device area first electrically conductive structure 16C for this embodiment of the present application includes materials mentioned above in the previous embodiment of the present application. The exemplary structure including the lower level dielectric cap 10, the fat level first interconnect dielectric material layer 12, the fill area first diffusion barrier liner 14A, the logic device area first diffusion barrier liner 14B, the ReRAM device area first diffusion barrier liner 14C, the fill area first electrically conductive structure 16A, the logic device area first electrically conductive structure 16B, and the ReRAM device area first electrically conductive structure 16C for this embodiment of the present application can be formed utilizing the processing techniques mentioned above for forming the structure beneath the dielectric capping layer 18 shown in FIGS. 1A, 1B and 1C.

In this embodiment of the present application, a dielectric material stack 50/52/54 is formed on the fat level first interconnect dielectric material layer 12 and above each first electrically conductive structure that is present in each of the fill area, the logic device area and the ReRAM device area. In the previous embodiment shown in FIGS. 1A, 1B and 1C only dielectric capping layer 18 was formed, not the dielectric material stack 50/52/54 as shown in FIGS. 11A, 11B and 11C.

The dielectric material stack 50/52/54 includes a first dielectric capping layer 50, an interlayer dielectric material layer 52, and a second dielectric capping layer 54. The first dielectric capping layer 50 and the second dielectric capping layer 54 include one of the dielectric capping materials mentioned above for the lower level dielectric cap 10. In some embodiments, the dielectric capping material that provides the first dielectric capping layer 50 can be compositionally the same as the dielectric capping material that provides the second dielectric capping layer 54. In other embodiments, the dielectric capping material that provides the first dielectric capping layer 50 can be compositionally different than the dielectric capping material that provides the second dielectric capping layer 54.

The first dielectric capping layer 50 and the second dielectric capping layer 54 can be formed utilizing one of the deposition processes mentioned above in forming the lower level dielectric cap 10. The first dielectric capping layer 50 provides the thickness required for fat wire dielectric capping thickness following process assumption (depending on fat wire levels, 20-100 nm). The second dielectric capping layer 54 can have a thickness from 20 nm 100 nm. Generally, the second dielectric capping layer 54 is designed to have a thickness that is greater or thinner than the first dielectric capping layer 50.

The interlayer dielectric (ILD) material layer 52 can be composed of one of the dielectric materials mentioned above for the fat level interconnect dielectric material layer 12. The dielectric material that provides the ILD material layer 52 can be compositionally the same as, or compositionally different from, the dielectric material that provides the fat level first interconnect dielectric interconnect material layer 12. The ILD material layer 52 can be formed utilizing one of the deposition processes mentioned above in forming the fat level first interconnect dielectric material layer 12. The ILD material layer 52 can have a thickness from 50 nm 500 nm; although other thicknesses for the ILD material layer 52 can be employed. The ILD material layer 52 thickness can be adjusted accordingly in order to raise the ReRAM-containing stack so that no lower via is needed (the ReRAM device area extended via 42V in FIG. 9C) but only an upper trench contacts the ReRAM device area top electrode 26C.

After forming the dielectric material stack 50/52/54, bottom electrode openings are formed in the dielectric material stack 50/52/54 that is present in both the fill area and ReRAM device area, but not the logic device area. Notably, a fill area bottom electrode opening 56A is formed in the dielectric material stack 50/52/54 that is present in the fill area, while a ReRAM device area bottom electrode opening 56C is formed in the dielectric material stack 50/52/54 that is present in the ReRAM device area. The fill area bottom electrode opening 56A and the ReRAM device area bottom electrode opening 56C are formed by lithography and etching. The etching can include one or more etching (dry etching and/or wet etching) processes.

Figure 12C:
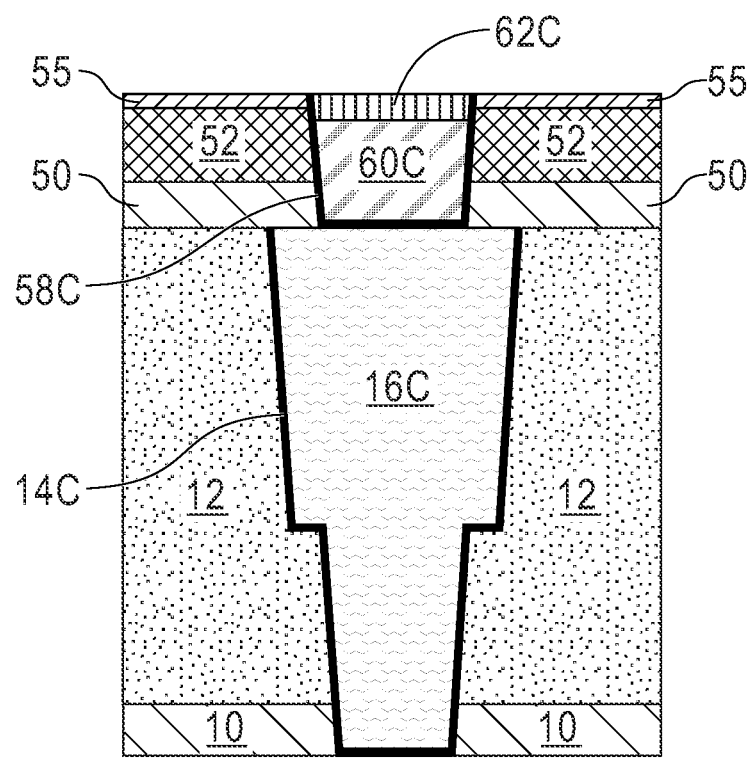

Referring now to FIGS. 12A, 12B and 12C, there are shown the exemplary structure shown in FIGS. 11A, 11B and 11C, respectively, after forming a base electrode in the bottom electrode opening that is present in both the fill area and the ReRAM device area, and a bottom electrode on each base electrode. In some embodiments, a bottom electrode diffusion barrier liner can be formed in each bottom electrode opening prior to forming the base electrode and bottom electrode. In some embodiments, the base electrode can be omitted from the exemplary structure.

Notably, and as shown in FIG. 12A, an optional fill area bottom electrode diffusion barrier liner 58A, a fill area base electrode 60A, and a fill area bottom electrode 62A are formed in the fill area bottom electrode opening 56A. In some embodiments, the optional fill area bottom electrode diffusion barrier liner 58A is present along the sidewall and bottommost surface of the fill area base electrode 60A as well as along a sidewall of the fill area bottom electrode 62A. In embodiments of the present application and as is shown in FIG. 11A, the fill area bottom electrode 62A has a topmost surface that is coplanar with at least a topmost surface of a reduced thickness second dielectric capping layer (i.e., thinned second dielectric capping layer 55) of the original dielectric material stack 50/52/54. When present, the optional fill area bottom electrode diffusion barrier liner 58A can have a topmost surface that is coplanar with a topmost surface of the fill area bottom electrode 62A and a topmost surface of the thinned second dielectric capping layer 55.

As is shown in FIG. 12C, an optional ReRAM device area bottom electrode diffusion barrier liner 58C, a ReRAM device area base electrode 60C, and a ReRAM device area bottom electrode 62C are formed in each ReRAM device area bottom electrode opening 56C. In some embodiments, the optional ReRAM device area bottom electrode diffusion barrier liner 58C is present along the sidewall and bottommost surface of the ReRAM device area base electrode 60C and a sidewall of the ReRAM device area bottom electrode 62C. In embodiments of the present application and as is shown in FIG. 11C, the ReRAM device area bottom electrode 62C has a topmost surface that is coplanar with at least a topmost surface of the thinned second dielectric capping layer 55. When present, the optional ReRAM device area bottom electrode diffusion barrier liner 58C can have a topmost surface that is coplanar with a topmost surface of the ReRAM device area bottom electrode 62C and a topmost surface of the thinned second dielectric capping layer 55.

The optional fill area diffusion barrier liner 58A and the optional ReRAM device area bottom electrode diffusion barrier liner 58C can be composed of one of the diffusion barrier materials mentioned above for the fill area first diffusion barrier liner 14A, the logic device area first diffusion barrier liner 14B, and the ReRAM device area first diffusion barrier liner 14C.

The fill area base electrode 60A and the ReRAM device area base electrode 60C are composed of any BEOL conducting material, and the base electrodes, 60A, 60C, can be recessed, and filled with a BEOL conducting material that provides the bottom electrode, 62A and 62C, followed by CMP.

The fill area bottom electrode 62A and the ReRAM device area bottom electrode 62C can be composed of the conductive materials mentioned above for the fill area bottom electrode 22A and the ReRAM device area bottom electrode 22C. In another embodiment, the bottom electrode openings, 56A, 56C, can entirely contain the bottom electrodes 62A and 62C (thus, an in such an embodiment, no base electrodes 60A and 60C are present).

The exemplary structures shown in FIGS. 12A and 12C can be formed by first forming an optional diffusion barrier material layer in each bottom electrode opening and atop the second dielectric material layer 54, forming an conductive material layer on the optional diffusion barrier material layer, performing a planarization process to remove the optional diffusion barrier material layer and the conductive material layer that is present outside each bottom electrode opening, recessing the conductive material layer that remains in each bottom electrode opening, forming a conductive material in the recessed area, and optionally performing another planarization process.

As is shown in FIG. 12A, the fill area base electrode 60A has a width, i.e., critical dimension, that is less than a width, i.e., critical dimension, of the fill area first electrically conductive structure 16A, while the ReRAM device area base electrode 60C has a width, i.e., critical dimension, that is less than a width, i.e., critical dimension, of the ReRAM device area first electrically conductive structure 16C.

Figure 13C:
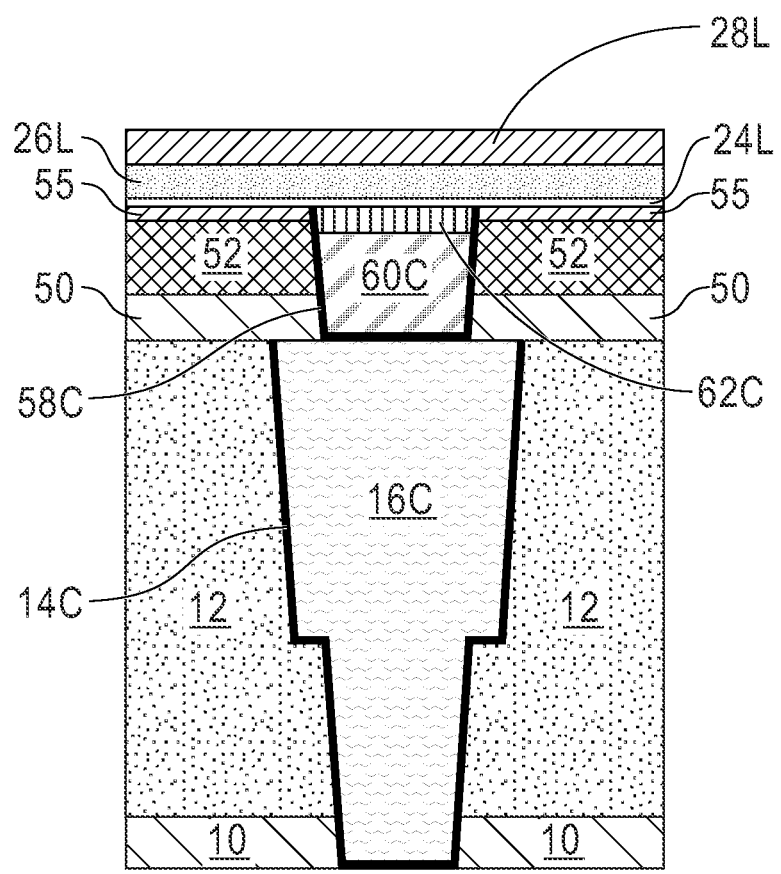

Referring now to FIGS. 13A, 13B and 13C, there are illustrated the exemplary structure shown in FIGS. 12A, 12B and 12C, respectively, after forming a ReRAM-containing material stack and a hard mask layer 28L in each of the fill area, the logic device area, and the ReRAM device area, the ReRAM-containing material stack including a dielectric switching layer 24L and a top electrode layer 26L.

The dielectric switching layer 24L, the top electrode layer 26 and the hard mask layer 28L used in this embodiment of the present application are the same as the dielectric switching layer 24L, the top electrode layer 26L and the hard mask layer 28L used in the previous embodiment of the present application. See, for example, FIGS. 3A-3C and the discussion above regarding the dielectric switching layer 24L, the top electrode layer 26 and the hard mask layer 28L which apply equally well here for this embodiment of the present application. The dielectric switching layer 24L, the top electrode layer 26 and the hard mask layer 28L for this embodiment can be formed utilizing the techniques for forming the dielectric switching layer 24L, the top electrode layer 26L and the hard mask layer 28L in the embodiment illustrated in FIGS. 3A-3C of the present application.

Figure 14C:
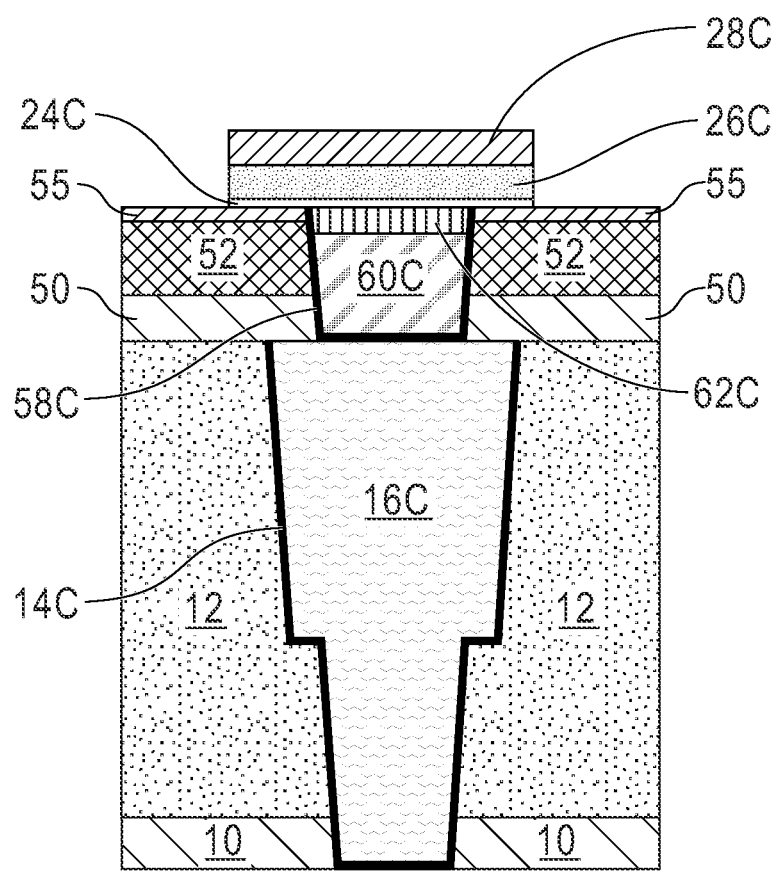

Referring now to FIGS. 14A, 14B and 14C, there are illustrated the exemplary structure shown in FIGS. 13A, 13B and 13C, respectively, after patterning the dielectric hard mask layer 28L and the ReRAM-containing material stack 24L/26L to provide a dielectric hard mask capped ReRAM-containing structure in each of the fill area and the ReRAM device area, while entirely removing the dielectric hard mask layer and the ReRAM-containing material stack that is present in the logic device area.

Patterning of the dielectric hard mask layer 28L and the ReRAM-containing material stack 26L/24L includes lithography and etching as described above in forming the structure shown in FIGS. 4A-4C. The dielectric hard mask capped ReRAM-containing structure that is present in the fill area includes a remaining portion of the hard mask layer 28L and a remaining portion of the ReRAM-containing material stack 24L/26L. The remaining portion of the hard mask layer 28L in the fill area can be referred to as a fill area hard mask 28A, while the remaining portion of the ReRAM-containing material stack 24L/26L in the fill area can be referred to as a fill area ReRAM-containing stack 24A/26A. The fill area ReRAM-containing stack 24A/26A includes a remaining portion of the top electrode layer 26L (hereinafter referred to a fill area top electrode 26A) and a remaining portion of the dielectric switching layer 24L (hereinafter referred to as a fill area dielectric switching layer 24A). As is shown in FIG. 14A, the fill area hard mask 28A has an outermost surface that is vertically aligned with an outermost surface of both the fill area top electrode 26A and the fill area dielectric switching layer 24A. As is further shown in FIG. 14A, the fill area ReRAM-containing stack 24A/26A has a width, i.e., critical dimension, that is greater than a width, i.e., critical dimension, of the underlying fill area bottom electrode 62A. As is even further shown in FIG. 14A, the fill area ReRAM-containing stack 24A/26A is present on a topmost surface of the fill area bottom electrode 62A as well as a topmost surface of the thinned second dielectric capping layer 55 that is present in the fill area. The fill area ReRAM-containing stack 24A/26A is a non-active ReRAM-containing stack.

The dielectric hard mask capped ReRAM-containing structure that is present in the ReRAM device area includes another remaining portion of the hard mask layer 28L and another remaining portion of the ReRAM-containing material stack 24L/26L. This remaining portion of the hard mask layer 28L in the ReRAM device area can be referred to as a ReRAM device area hard mask 28C, while this remaining portion of the ReRAM-containing material stack 24L/26L in the ReRAM device area can be referred to as a ReRAM device area ReRAM-containing stack 24C/26C. The ReRAM device area ReRAM-containing stack 24C/26C includes a remaining portion of the top electrode layer 26L (hereinafter referred to a ReRAM device area top electrode 26C) and a remaining portion of the dielectric switching layer 24L (hereinafter referred to as a ReRAM device area dielectric switching layer 24C). As is shown in FIG. 14C, the ReRAM device area hard mask 28C has an outermost surface that is vertically aligned with an outermost surface of both the ReRAM device area top electrode 26C and the ReRAM device area dielectric switching layer 24C. As is further shown in FIG. 14C, the ReRAM device area ReRAM-containing stack 24C/26C has a width, i.e., critical dimension, that is greater than a width, i.e., critical dimension, of the underlying ReRAM device area bottom electrodes 62C. As is even further shown in FIG. 14C, the ReRAM device area ReRAM-containing stack 24C/26C is present on a topmost surface of both ReRAM device area bottom electrodes 22C as well as a topmost surface of the thinned second dielectric capping layer 55 that is present in the ReRAM device area.

Figure 15C:
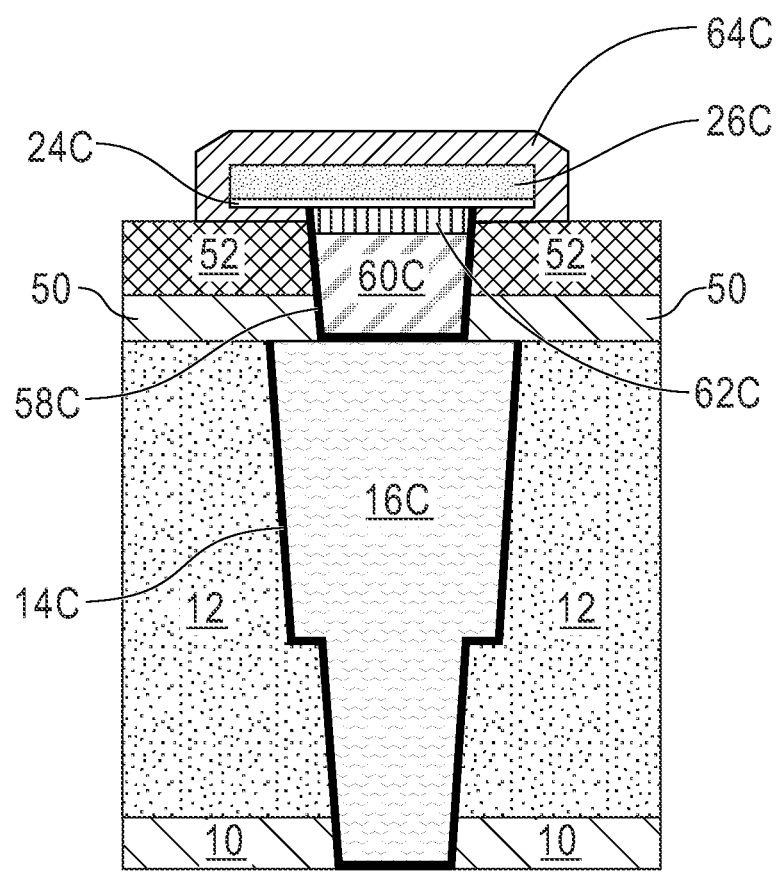

Referring now to FIGS. 15A, 15B and 15C, there are illustrated the exemplary structure shown in FIGS. 14A, 14B and 14C, respectively, after forming a dielectric encapsulation structure in each of the fill area, the logic device area and the ReRAM device area. The dielectric encapsulation structure is formed by depositing a dielectric encapsulation layer (not shown) and performing a spacer etch back process. The dielectric encapsulation layer used in this embodiment of the present application includes one of the dielectric materials mentioned above for dielectric encapsulation layer 30L.

It is noted that the thickness of each dielectric encapsulation structure that is present atop the ReRAM-containing stack substantially matches the thickness of the first dielectric capping layer 50. It is also noted that during the spacer etch back process the thinned second dielectric capping layer 55 is completely removed from the logic device area.

The dielectric encapsulation structure in the fill area can be referred as to the fill area dielectric encapsulation layer structure 64A. The fill area dielectric encapsulation layer structure 64A includes a remaining portion of the dielectric encapsulation layer and the fill area hard mask 28A. As is shown in FIG. 14A, the fill area dielectric encapsulation layer structure 64A surrounds the fill area ReRAM-containing stack 24A/26A.

The dielectric encapsulation structure in the ReRAM device area can be referred as to the ReRAM device area dielectric encapsulation layer structure 64C. The ReRAM device area dielectric encapsulation layer structure 64C includes a remaining portion of the dielectric encapsulation layer and the ReRAM device area hard mask 28C. As is shown in FIG. 14C, the ReRAM device area dielectric encapsulation layer structure 64C surrounds the ReRAM device area ReRAM-containing stack 24C/26C. The thickness of the fill area dielectric encapsulation structure 64A and the ReRAM device area dielectric encapsulation structure 64C should be the same as thickness of the first dielectric capping layer 50 so that the nitride punch through process for etching dielectric cap material above the ReRAM-containing stack in both the ReRAM device area and fill area, and dielectric material in the logic via. See, FIGS. 18A, 18B and 18C.

Figure 16C:
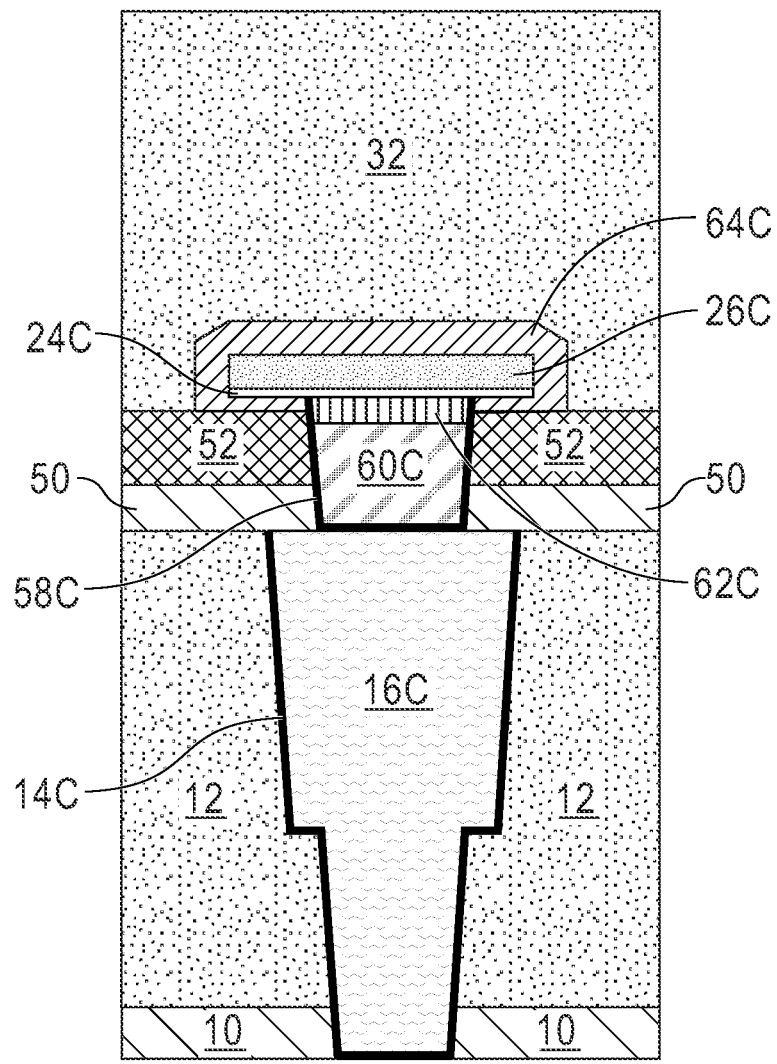

Referring now to FIGS. 16A, 16B and 16C, there are illustrated the exemplary structure shown in FIGS. 15A, 15B and 15C, respectively, after forming a fat level second interconnect dielectric material layer 32 on, and laterally adjacent to, the dielectric encapsulation structure in each of the fill area, the logic device area and the ReRAM device area. The fat level second interconnect dielectric material layer 32 of this embodiment of the present application is the same as the fat level second interconnect dielectric material layer 32 described in the previous embodiment of the present application. See, for example, FIGS. 7A-7C and the discussion regarding the fat level second interconnect dielectric material layer 32 for that embodiment of the present application, which is applicable here for this embodiment of the present application.

Figure 17A:
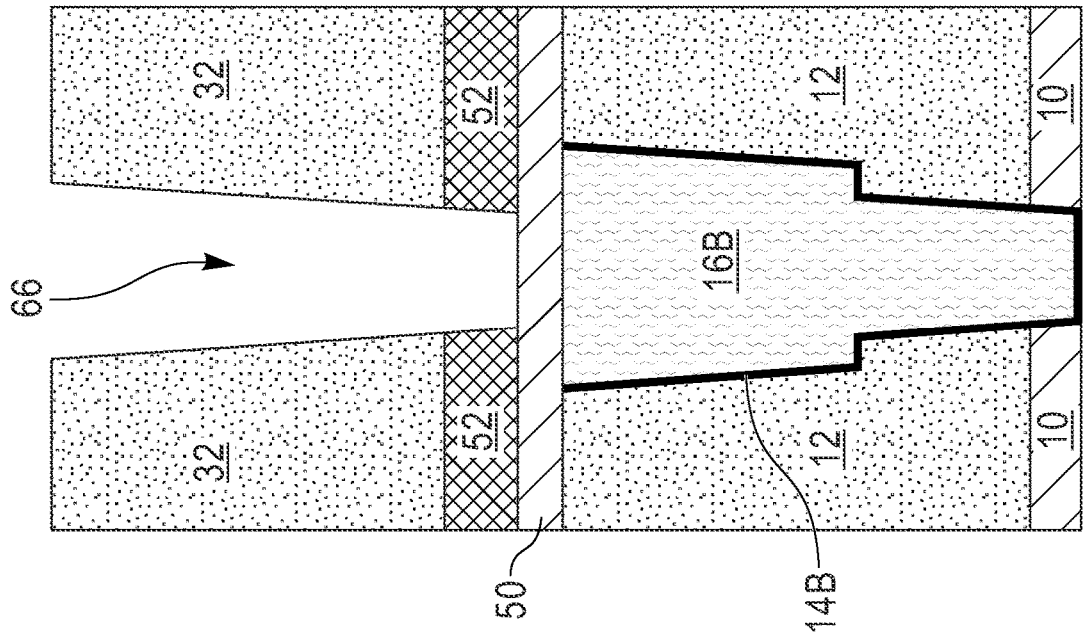
FIGS. 17A, 17B and 17C are cross sectional views of the exemplary structure shown in FIGS. 16A, 16B and 16C, respectively, forming a logic device contact via in the fat level second interconnect dielectric material layer that is present in the logic device area.
Figure 17B:
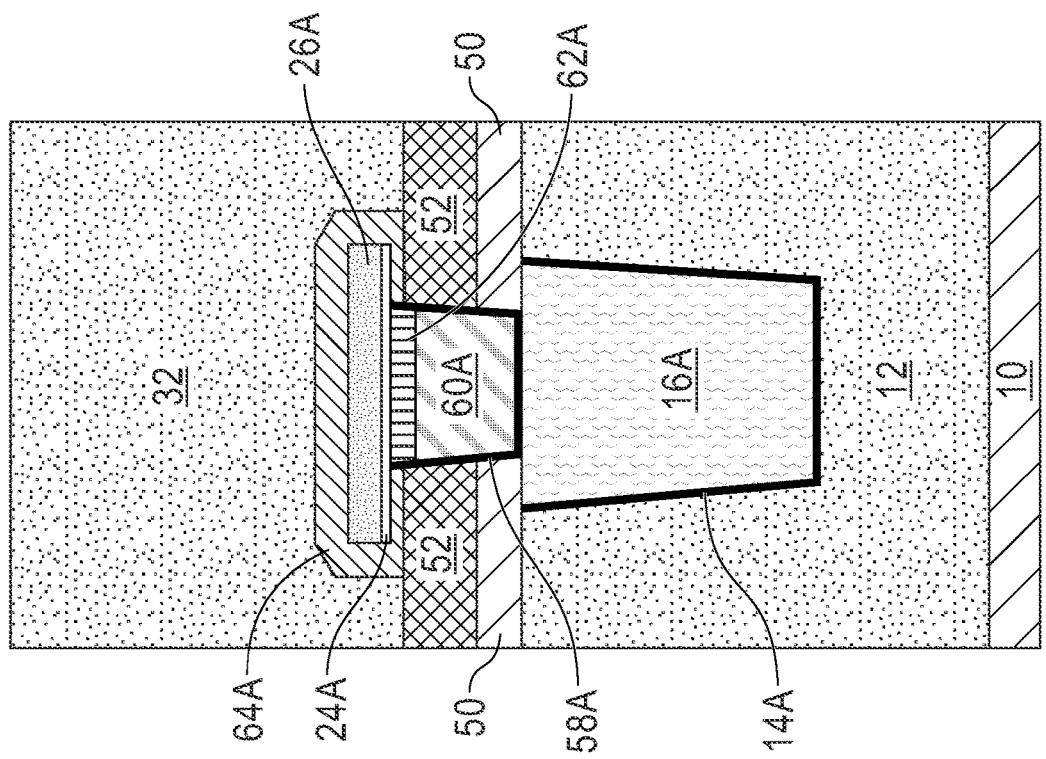
Figure 17C:
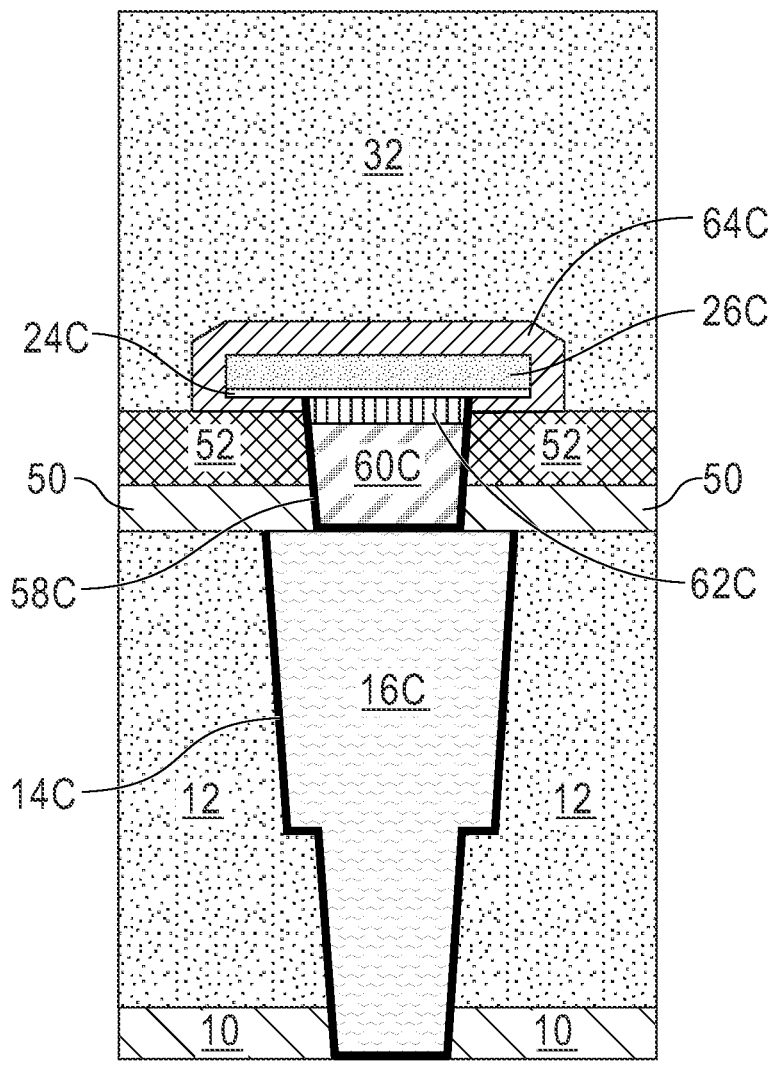

Referring now to FIGS. 17A, 17B and 17C, there are illustrated the exemplary structure shown in FIGS. 16A, 16B and 16C, respectively, forming a logic device contact via 66 in the fat level second interconnect dielectric material layer 32 that is present in the logic device area. The logic device contact via 66 can be formed by lithography and etching. In some embodiments, and as is shown in FIG. 17B, the etch stops on surface of the first dielectric capping layer 50 that is present in the logic device area. In other embodiments, the etch stops on the ILD material layer 52 in the logic device area and a separate etch is then used to open the ILD material layer 52 in the logic device area.

The logic device contact via 66 can have sidewalls that are perpendicular to the underlying topmost surface of the first dielectric capping layer 50, or the logic device contact via 66 can have tapered sidewalls.

Figure 18A:
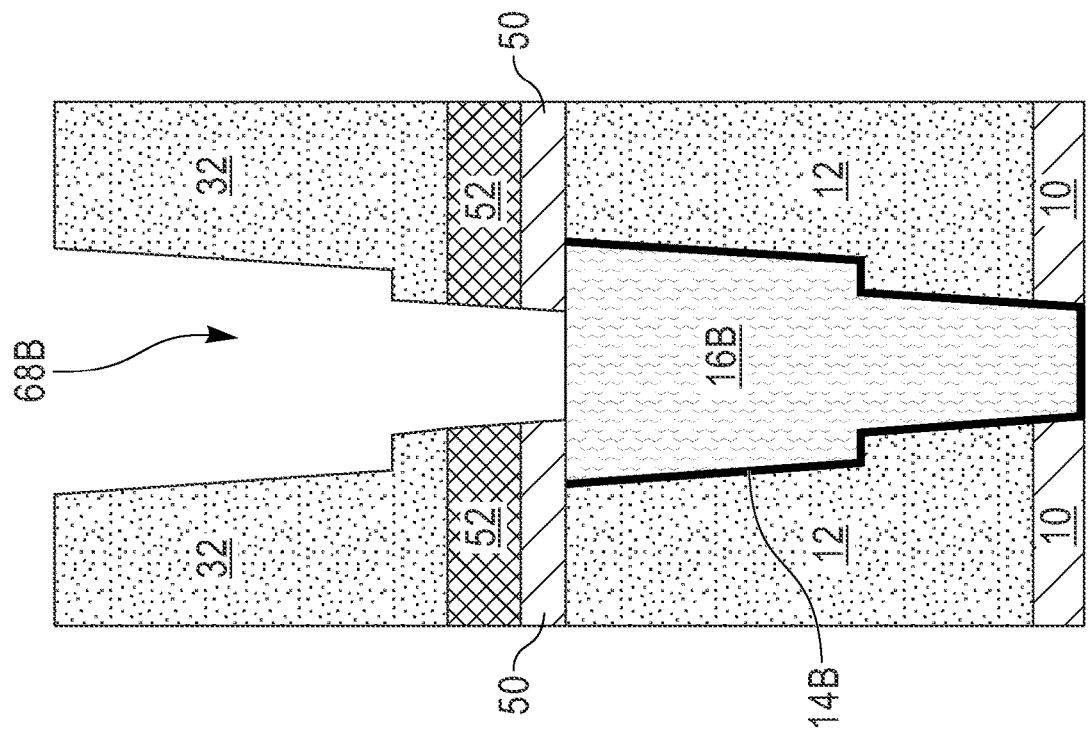
FIGS. 18A, 18B and 18C are cross sectional views of the exemplary structure shown in FIGS. 17A, 17B and 17C after forming a contact trench in the fat level second interconnect dielectric material layer that is present in each of the fill area, the logic device area and the ReRAM device area.
Figure 18B:
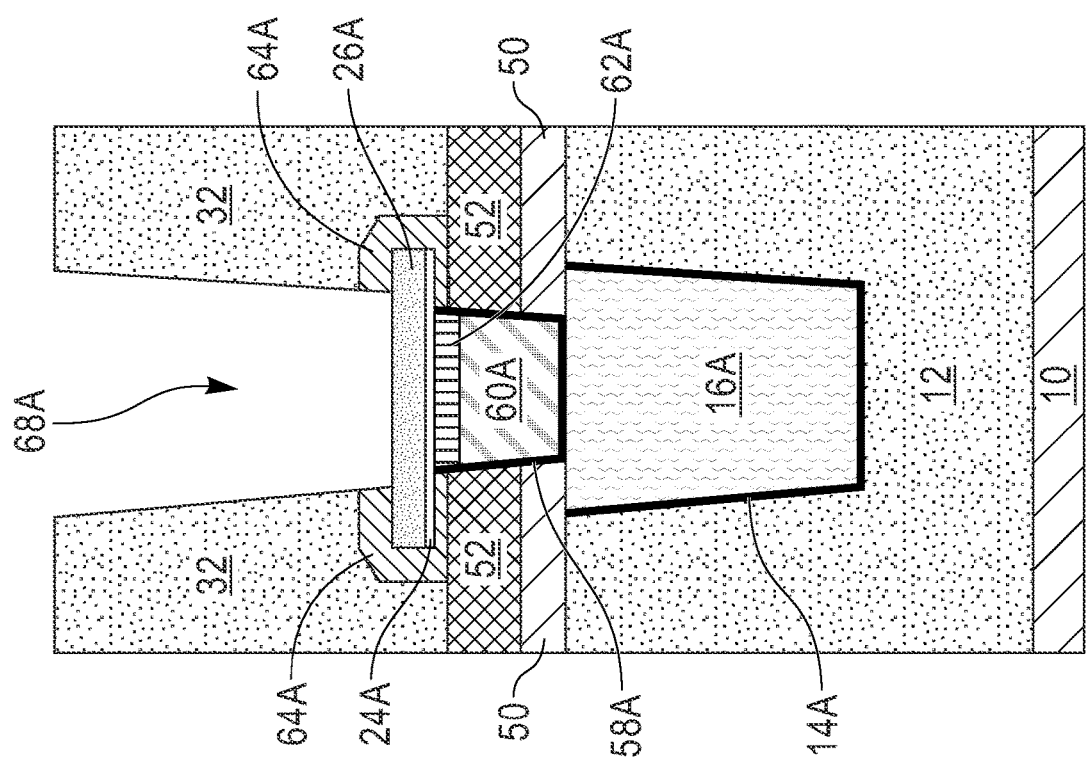
Figure 18C:
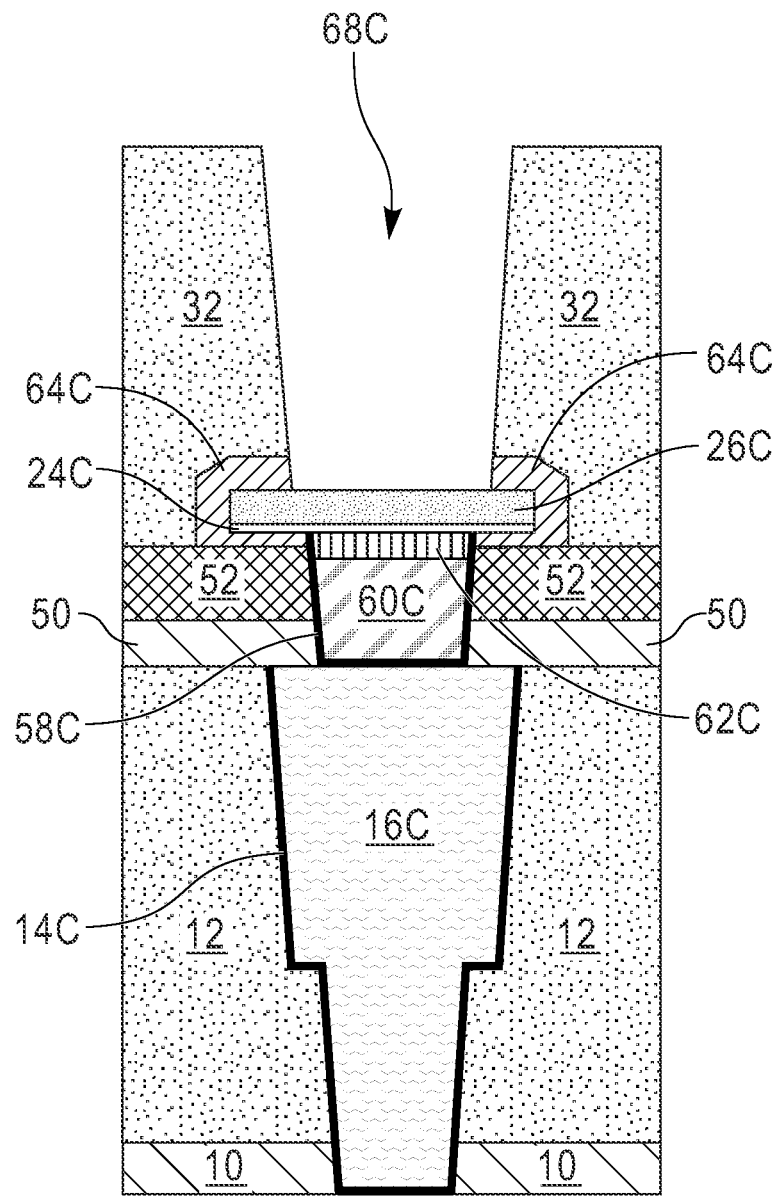

Referring now to FIGS. 18A, 18B and 18C, there is there is illustrated the exemplary structure shown in FIGS. 17A, 17B and 17C after forming a contact trench in the fat level second interconnect dielectric material layer 32 that is present in each of the fill area, the logic device area and the ReRAM device area. The logic device contact via 66 is filled with OPL and protected. Trench lithography stack is covered over OPL and patterned in resist.

The contact trenches can be formed by lithography and etching. The etch can include a dry etching process or a chemical wet etch. The nitride punch through etch in the fill area physically exposes the top electrode 26A in the fill area, the punch through etch in the logic device area physically exposes a portion of the underlying first logic device electrically conductive structure 16B, while the punch through etch physically exposes the top electrode 26C in the ReRAM device area.

The contact trench that is formed in the fill area and the nitride punch through area can be referred to herein as a fill area contact opening 68A. The contact trench that is formed in the logic device area can be referred to as a logic device area contact trench, which is located above and in communication with a logic device area extended via. The logic device area extended via includes a lower portion of the logic device area via 66 and the punch through area. Collectively, the logic device area contact trench and the logic device area extended via provide a combined logic device area contact opening 68B that physically exposes a surface of the logic device area first electrically conductive structure 16B. The contact trench that is formed in the ReRAM device area can be referred to as a ReRAM device area contact trench which is connected to the nitride punch through area formed in the ReRAM device area. Collectively, the ReRAM device area contact trench and the punch through area provide a ReRAM device area contact opening 68C that physically exposes a surface of the top electrode 26C as is shown in FIG. 18C.

Figure 19C:
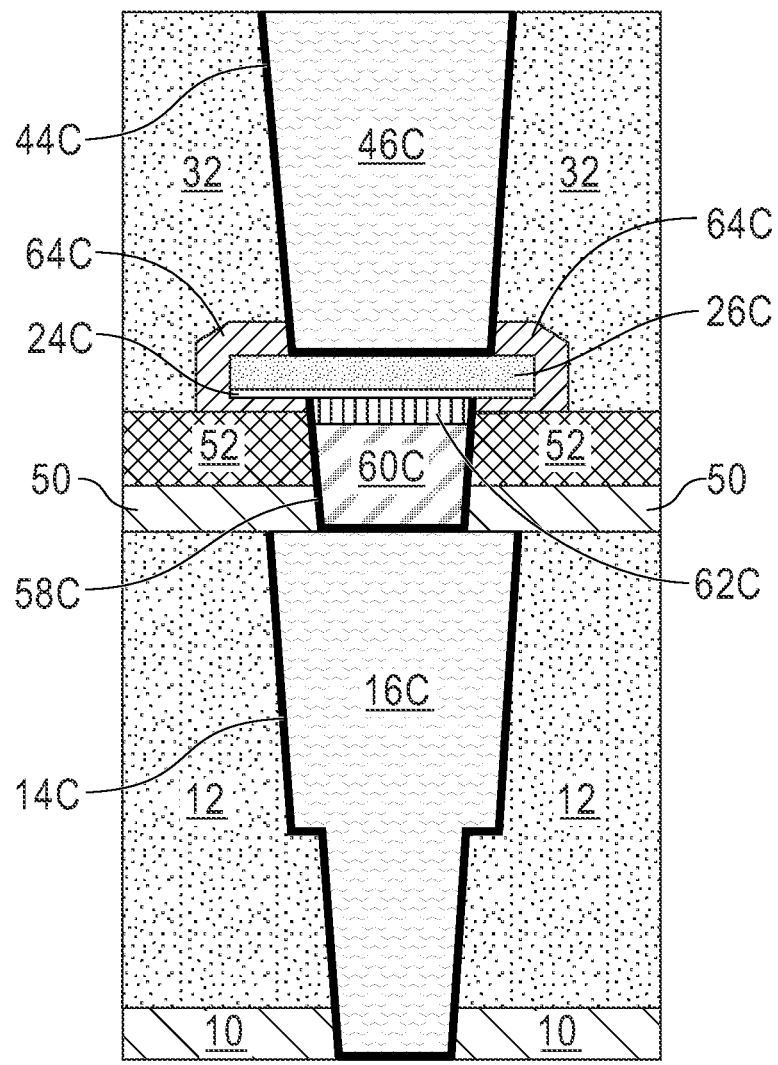

Referring now to FIGS. 19A, 19B and 19C, there is illustrated the exemplary structure of FIGS. 18A, 18B and 18C after forming a contact structure in the fat level second interconnect dielectric material layer 32 that is present in each of the fill area, the logic device area and the ReRAM device area.

Notably, a contact structure is formed in the fill area contact opening 68A. The contact structure that is formed in the fill area contact opening 68A can be referred to as a fill area contact structure. The fill area contact structure, which is shown in FIG. 10A, includes an optional fill area second diffusion barrier liner 44A and a fill area second electrically conductive structure 46A. As is shown in FIG. 19A, the fill area second electrically conductive structure 46A has a trench shape and a topmost surface that is coplanar with at least a topmost surface of the fat level second interconnect dielectric material layer 32. When the fill area second diffusion barrier liner 44A is present, the fill area second electrically conductive structure 46A has a topmost surface that is coplanar with a topmost surface of both the fill area second diffusion barrier liner 44A and the fat level second interconnect dielectric material layer 32. When present, the fill area second diffusion barrier liner 44A is present along the sidewall and bottommost surface of the fill area second electrically conductive structure 46A. The fill area contact structure including at least the fill area second electrically conductive structure 46A is in electrical contact with the underlying top electrode 26A of the fill area ReRAM-containing stack 24C/26C.

A contact structure is also formed in the logic device area contact opening 68. The contact structure that is formed in the logic device area contact opening 68 can be referred to as a logic device area contact structure. The logic device area contact structure, which is shown in FIG. 19B, includes an optional logic device area second diffusion barrier liner 44B and a logic device area second electrically conductive structure 46B. As is shown in FIG. 10B, the logic device area second electrically conductive structure 46B has a combined via and trench shape and a topmost surface that is coplanar with at least a topmost surface of the fat level second interconnect dielectric material layer 32. The via portion of the logic device area second electrically conductive structure 46B is located beneath the trench portion of the logic device area second electrically conductive structure 46B. When the logic device area second diffusion barrier liner 44B is present, the logic device area second electrically conductive structure 46B has a topmost surface that is coplanar with a topmost surface of both the logic device area second diffusion barrier liner 44B and the fat level second interconnect dielectric material layer 32. When present, the logic device area second diffusion barrier liner 44B is present along the sidewall and bottommost surface of the logic device area second electrically conductive structure 46B. The logic device area contact structure including at least the logic device area second electrically conductive structure 46B is in electrical contact with the underlying logic device area first electrically conductive structure 16B.

A contact structure is also formed in the ReRAM device area contact opening 68C. The contact structure that is formed in the ReRAM device area contact opening 68C can be referred to as a ReRAM device area contact structure. The ReRAM device area contact structure, which is shown in FIG. 19C, includes an optional ReRAM device area second diffusion barrier liner 44C and a ReRAM device area second electrically conductive structure 46C. As is shown in FIG. 19C, the ReRAM device area second electrically conductive structure 46C has a trench shape and a topmost surface that is coplanar with at least a topmost surface of the fat level second interconnect dielectric material layer 32. When the ReRAM device area second diffusion barrier liner 44C is present, the ReRAM device area second electrically conductive structure 46C has a topmost surface that is coplanar with a topmost surface of both the ReRAM device area second diffusion barrier liner 44C and the fat level second interconnect dielectric material layer 32. When present, the ReRAM device area second diffusion barrier liner 44C is present along the sidewall and bottommost surface of the ReRAM device area second electrically conductive structure 46C. The ReRAM device area contact structure including at least the ReRAM device area second electrically conductive structure 46C is in electrical contact with the underlying top electrode 26C of the ReRAM device area ReRAM-containing stack 24C/26C.

The fill area second diffusion barrier liner 44A, the logic device area second diffusion barrier liner 44B and the ReRAM device area second diffusion barrier liner 44C can be composed of one of the diffusion barriers mentioned above for the fill area first diffusion barrier liner 14B, logic device area first diffusion barrier liner 14B, and the ReRAM device area diffusion barrier layer 14C.

The fill area second electrically conductive structure 46A, the logic device area second electrically conductive structure 46B and the ReRAM device area second electrically conductive structure 46C can be composed of one of the conductive materials mentioned above for the fill area first electrically conductive structure 16A, the logic device area first electrically conductive structure 16B and the ReRAM device area first electrically conductive structure 16C.

Each contact structure including at least the fill area second electrically conductive structure 46A, the logic device area second electrically conductive structure 46B and the ReRAM device area second electrically conductive structure 46C.

The contact structures shown in FIGS. 19A-19B includes materials (i.e., diffusion barrier materials and electrically conductive materials) as mentioned above in providing the structure shown in FIGS. 10A-10B. The contact structures shown in FIGS. 19A-19B can be formed utilizing the techniques mentioned above for forming the contact structures shown in FIGS. 10A-10B.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
    a resistive random access memory (ReRAM) device area comprising a ReRAM device area first electrically conductive structure embedded in a fat level first interconnect dielectric material layer;
    a lower level dielectric cap located beneath the fat level first interconnect dielectric material layer;
    a ReRAM device area bottom electrode located on a surface of the ReRAM device area first electrically conductive structure;
    a dielectric capping layer located laterally adjacent to the ReRAM device area bottom electrode,
    a ReRAM device area ReRAM-containing stack located on the ReRAM device area bottom electrode, wherein the ReRAM device area ReRAM-containing stack comprises a ReRAM device area dielectric switching layer and a ReRAM device area top electrode; and
    a ReRAM device area contact structure located above, and in contact with, the ReRAM device area top electrode, wherein the ReRAM device area contact structure has a lower via portion and an upper trench portion.

2. The structure of claim 1, further comprising a fat level second interconnect dielectric material layer located above the fat level first interconnect dielectric material layer, wherein at least the ReRAM device area contact structure is embedded in the fat level second interconnect dielectric material layer.

3. The structure of claim 1, further comprising a ReRAM device area dielectric encapsulation structure located laterally adjacent and on a portion of the ReRAM device area top electrode.

4. The structure of claim 3, wherein the ReRAM device area dielectric encapsulation structure comprising a dielectric encapsulation layer and a ReRAM hard mask.

5. The structure of claim 4, wherein the ReRAM device area dielectric encapsulation structure atop the ReRAM device area ReRAM-containing stack has a thickness that substantially matches a thickness of the dielectric capping layer.

6. The structure of claim 1, further comprising a logic device area located laterally adjacent to the ReRAM device area, the logic device area comprising a logic device area first electrically conductive structure embedded in the fat level first interconnect dielectric material layer, and a logic device area contact structure located above, and in contact with, the logic device area first electrically conductive structure, wherein logic device area contact structure has a lower via portion and an upper trench portion.

7. The structure of claim 6, further comprising a fill area located laterally adjacent to the logic device area and the ReRAM device area, wherein the fill area comprises a fill area first electrically conductive structure embedded in the fat level first interconnect dielectric material layer, a fill area bottom electrode located on a surface of the fill area first electrically conductive structure, a non-active fill area ReRAM-containing stack located on the fill area bottom electrode, and a fill area contact structure located above, and spaced apart from the non-active fill area ReRAM-containing stack.

8. The structure of claim 1, wherein the ReRAM device area bottom electrode has a topmost surface that is coplanar with a topmost surface of the dielectric capping layer.

9. The structure of claim 1, wherein a lower portion of the ReRAM device area first electrically conductive structure extends entirely through the lower level dielectric cap.

10. The structure of claim 1, wherein a ReRAM device area base electrode is located beneath the ReRAM device area bottom electrode.

11. The structure of claim 1, wherein the ReRAM device area ReRAM-containing stack has a first width, and the ReRAM device area bottom electrode has a second width that is less than the first width.

12. A structure comprising:
    a resistive random access memory (ReRAM) device area comprising a ReRAM device area first electrically conductive structure embedded in a fat level first interconnect dielectric material layer;
    a ReRAM device area bottom electrode located on a surface of the ReRAM device area first electrically conductive structure;
    a dielectric material stack located laterally adjacent to, and embedding, the ReRAM device area bottom electrode, wherein the dielectric material stack comprising a dielectric capping layer and an interlayer dielectric material;
    a lower level dielectric cap located beneath the fat level first interconnect dielectric material layer;
    a ReRAM device area ReRAM-containing stack located on the ReRAM device area bottom electrode, wherein the ReRAM device area ReRAM-containing stack comprises a ReRAM device area dielectric switching layer and a ReRAM device area top electrode;
    a ReRAM device area dielectric encapsulation structure surrounding the ReRAM device area ReRAM-containing stack; and
    a ReRAM device area contact structure located above, and in contact with, the ReRAM device area top electrode.

13. The structure of claim 12, further comprising a fat level second interconnect dielectric material layer located above the fat level first interconnect dielectric material layer, wherein at least the ReRAM device area contact structure is embedded in the fat level second interconnect dielectric material layer.

14. The structure of claim 13, wherein the ReRAM device area dielectric encapsulation structure comprising a dielectric encapsulation layer and a ReRAM hard mask.

15. The structure of claim 14, wherein the ReRAM dielectric encapsulation structure atop the ReRAM device area ReRAM-containing stack has a thickness that substantially matches a thickness of the dielectric capping layer.

16. The structure of claim 12, further comprising a logic device area located laterally adjacent to the ReRAM device area, the logic device area comprising a logic device area first electrically conductive structure embedded in the fat level first interconnect dielectric material layer, and a logic device area contact structure located above, and in contact with, the logic device area first electrically conductive structure, wherein logic device area contact structure has a lower via portion and an upper trench portion.

17. The structure of claim 16, further comprising a fill area located laterally adjacent to the logic device area and the ReRAM device area, wherein the fill area comprises a fill area first electrically conductive structure embedded in the fat level first interconnect dielectric material layer, a fill area bottom electrode located on a surface of the fill area first electrically conductive structure, a non-active fill area ReRAM-containing stack located on the fill area bottom electrode, and a fill area trench structure located above the non-active fill area ReRAM-containing stack.

18. The structure of claim 17, wherein further comprising a ReRAM device area base electrode located beneath the ReRAM device area bottom electrode, and a fill area base electrode located beneath the fill area bottom electrode.

19. The structure of claim 12, wherein a lower portion of the ReRAM device area first electrically conductive structure extends entirely through the lower level dielectric cap.

20. The structure of claim 12, wherein the ReRAM device area ReRAM-containing stack has a first width, and the ReRAM device area bottom electrode has a second width that is less than the first width.

* * * * *